(12) United States Patent
Rodriguez et al.

(10) Patent No.: US 11,552,007 B2
(45) Date of Patent: Jan. 10, 2023

(54) MODIFIED LEADFRAME DESIGN WITH ADHESIVE OVERFLOW RECESSES

(71) Applicant: STMicroelectronics, Inc., Calamba (PH)

(72) Inventors: Rennier Rodriguez, Bulacan (PH); Aiza Marie Agudon, Calamba (PH); Jefferson Talledo, Calamba (PH); Moonlord Manalo, Las Pinas (PH); Ela Mia Cadag, Calamba (PH); Rammil Seguido, Malolos (PH)

(73) Assignee: STMicroelectronics, Inc., Calamba (PH)

( * ) Notice: Subject to any disclaimer, the term of this patent is extended or adjusted under 35 U.S.C. 154(b) by 149 days.

(21) Appl. No.: 17/185,742

(22) Filed: Feb. 25, 2021

(65) Prior Publication Data

US 2021/0183750 A1 Jun. 17, 2021

Related U.S. Application Data

(63) Continuation of application No. 16/800,923, filed on Feb. 25, 2020, now Pat. No. 10,957,634, which is a
(Continued)

(51) Int. Cl.
*H01L 23/495* (2006.01)
*H01L 23/31* (2006.01)
(Continued)

(52) U.S. Cl.
CPC .... *H01L 23/49565* (2013.01); *H01L 21/4825* (2013.01); *H01L 21/4842* (2013.01); *H01L 21/56* (2013.01); *H01L 23/3114* (2013.01); *H01L 23/3142* (2013.01); *H01L 23/49503* (2013.01); *H01L 23/49513* (2013.01); *H01L 23/49548* (2013.01); *H01L 23/3107* (2013.01);
(Continued)

(58) Field of Classification Search
CPC . H01L 21/56; H01L 23/3114; H01L 23/49503
See application file for complete search history.

(56) References Cited

U.S. PATENT DOCUMENTS

| 4,195,193 A | 3/1980 | Grabbe et al. |
| 5,032,438 A | 7/1991 | Sakumoto et al. |

(Continued)

FOREIGN PATENT DOCUMENTS

| CN | 1481019 A | 3/2004 |
| CN | 2893922 Y | 4/2007 |

(Continued)

*Primary Examiner* — Anthony Ho
(74) *Attorney, Agent, or Firm* — Seed Intellectual Property Law Group LLP

(57) ABSTRACT

The present disclosure is directed to a leadframe having a recess in a body of the leadframe to collect glue overflowing from the manufacturing process of coupling a semiconductor die to the leadframe. The recess extends beneath an edge of the semiconductor die so that any tendency of the glue to adhere to the semiconductor die is counteracted by a tendency of the glue to adhere to a wall of the recess and at least partially fill the volume of the recess. In addition, the recess for collecting adhesive may also form a mold lock on an edge of the leadframe, the mold lock providing a more durable connection between the leadframe and an encapsulant during physical and temperature stresses.

20 Claims, 25 Drawing Sheets

Related U.S. Application Data continuation of application No. 16/154,538, filed on Oct. 8, 2018, now Pat. No. 10,615,104, which is a continuation of application No. 15/399,234, filed on Jan. 5, 2017, now Pat. No. 10,109,563.

(51) Int. Cl.
*H01L 21/48* (2006.01)
*H01L 21/56* (2006.01)

(52) U.S. Cl.
CPC ............... *H01L 2224/27013* (2013.01); *H01L 2224/32245* (2013.01); *H01L 2224/48091* (2013.01); *H01L 2224/48247* (2013.01); *H01L 2224/73265* (2013.01); *H01L 2224/83192* (2013.01); *H01L 2224/83385* (2013.01); *H01L 2224/92247* (2013.01); *H01L 2924/181* (2013.01)

(56) References Cited

U.S. PATENT DOCUMENTS

| | | |
|---|---|---|
| 5,168,368 A | 12/1992 | Gow, III et al. |
| 5,521,428 A | 5/1996 | Hollingsworth et al. |
| 5,914,528 A | 6/1999 | Takiar et al. |
| 6,281,568 B1 | 8/2001 | Glenn et al. |
| 8,310,060 B1 | 11/2012 | Nondhasittichai et al. |
| 8,383,962 B2 | 2/2013 | Sutardja |
| 2003/0168719 A1 | 9/2003 | Cheng et al. |
| 2004/0061205 A1 | 4/2004 | Han et al. |
| 2004/0070056 A1 | 4/2004 | Matsuzawa et al. |
| 2006/0186528 A1 | 8/2006 | Sasaki et al. |
| 2007/0278633 A1 | 12/2007 | Uematsu |
| 2009/0072367 A1 | 3/2009 | Poddar et al. |
| 2009/0152683 A1 | 6/2009 | Nguyen et al. |
| 2009/0209064 A1 | 8/2009 | Nonahasitthichai et al. |
| 2009/0236706 A1 | 9/2009 | Chen |
| 2010/0259908 A1 | 10/2010 | Sutardja |
| 2011/0089547 A1 | 4/2011 | Holloway |
| 2015/0228611 A1 | 8/2015 | Ng et al. |
| 2016/0104663 A1 | 4/2016 | Wong |

FOREIGN PATENT DOCUMENTS

| | | |
|---|---|---|
| CN | 102208391 A | 10/2011 |
| CN | 207338361 U | 5/2018 |
| JP | 6-252328 A | 9/1994 |

MODIFIED LEADFRAME DESIGN WITH ADHESIVE OVERFLOW RECESSES

BACKGROUND

Technical Field

The present disclosure is directed to a leadframe design that resists adhesive creep, and in particular to a leadframe with etched recesses to provide overflow reservoirs for semiconductor die glue.

Description of the Related Art

Semiconductor packages often include a semiconductor die and a leadframe that provides an interface between contacts and the semiconductor die. The semiconductor package can include an encapsulant to secure the elements of the package into a single discrete unit. The semiconductor die is typically placed on the leadframe, and the combination is covered with encapsulant in an application chamber. The encapsulant is typically applied at high pressure or temperature, and is then allowed to cool and solidify around the package elements.

Glue can provide superior electrical and thermal characteristics over a die attach film for attaching a die to a leadframe. Unfortunately, as die sizes continue to shrink, manufacturing with glue becomes more problematic due to adhesive creep, as can be appreciated from FIGS. 1-4.

As shown in FIG. 1, a chip package 100 includes a leadframe 101 with a main body 102 having a top surface 104. The leadframe 101 also includes a lead 106 separated from the main body 102 by an opening 108. A semiconductor die 110 with a bottom surface 112 is positioned over the main body 102 with a layer of adhesive 114 on the top surface 104.

FIG. 2 depicts the semiconductor die 110 just as it is lightly placed onto the adhesive 114. There has been no pressure applied to compress the semiconductor die 110 onto the leadframe 101. The weight of the semiconductor die 110 has caused the adhesive 114 to be pushed to the edges of the semiconductor die 110. FIG. 3 depicts the semiconductor coming to a rest fully compressed onto the adhesive 114. Due to the interaction of the adhesive with the surfaces of the main body 102 and the semiconductor 110, the adhesive creeps up a side surface 302 of the semiconductor 110. In some cases the adhesive may spread onto a top surface 304 of the semiconductor die 110.

FIG. 4 depicts the final steps to completing the chip package 100. A bond wire 402 is electrically coupled at a first end to a contact on the top surface 304 of the semiconductor die, and is electrically coupled at a second end to the lead 106. Then the entire assembly is covered with an encapsulant 406. As can be appreciated from FIG. 4, the adhesive is located between the semiconductor die 110 and the leadframe 101. In most embodiments, the adhesive is in contact with the bottom surface 112.

The adhesive 114 can be electrically conductive or insulating depending on the design choice. The adhesive 114 may also be a thermal insulator or a thermal conductor, depending on the design choice. In most prior art chip packages, the adhesive 114 is both an electrical conductor and a thermal conductor so that the back side of semiconductor die 110 is electrically connected to ground and acts to transfer heat from the semiconductor die 110 to the leadframe 101.

Adhesive creep may create an electrical or thermal coupling between the adhesive 114 and one or more contacts on the top surface 304, shorting some of the contacts together or to ground. Adhesive creep could also cover the die bond pad and prevent successful wire bonding. Because of adhesive creep, current adhesives can only be used with semiconductor dice that are at least 150 micrometers in thickness to prevent creep from coupling to top surface contacts. If the die is too thin, the adhesive may creep up the side more easily. Thus, what is needed is a device that prevents adhesive from creeping up the side surface of a thin semiconductor die.

BRIEF SUMMARY

The present disclosure is directed to a leadframe that prevents die adhesive from creeping up sides of a die attached to the leadframe. As the die and leadframe are coupled together during manufacturing, adhesive between the die and the leadframe expands in surface area covered and may flow towards the perimeter of the die. The leadframe includes at least one recess that collects excess adhesive to prevent the adhesive from reaching the perimeter of the die and climbing up a side surface of the die due to cohesive forces between the adhesive and the die. In some embodiments, the recess may extend around all sides of a main body of the leadframe, thus providing an isolated, die pad on the main body of the leadframe that the die attaches to.

In one embodiment, the leadframe may also include an encapsulant anchor around the edges of the main body of the leadframe, the encapsulant anchor reinforcing the connection between an encapsulant and the main body of the leadframe. The encapsulant anchor reinforces the connection to the encapsulant by increasing surface area of the joint and also by creating a hook and catch connection between the main body of the leadframe and the encapsulant. The anchors also act as additional barriers to moisture that make it more difficult for moisture to reach the die.

The present disclosure is also directed to methods of manufacturing a leadframe having at least one recess for receiving excess adhesive during manufacturing of a die. In one embodiment, the method of manufacturing may also include forming the encapsulant anchor described above. A method of forming a final package is also disclosed.

DETAILED DESCRIPTION

In the following description, certain specific details are set forth in order to provide a thorough understanding of various embodiments of the disclosure. However, one skilled in the art will understand that the disclosure may be practiced without these specific details. In other instances, well-known structures associated with electronic components and fabrication techniques have not been described in detail to avoid unnecessarily obscuring the descriptions of the embodiments of the present disclosure.

Unless the context requires otherwise, throughout the specification and claims that follow, the word "comprise" and variations thereof, such as "comprises" and "comprising," are to be construed in an open, inclusive sense; that is, as "including, but not limited to."

Reference throughout this specification to "one embodiment" or "an embodiment" means that a particular feature, structure or characteristic described in connection with the embodiment is included in at least one embodiment. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

As used in this specification and the appended claims, the singular forms "a," "an," and "the" include plural referents unless the content clearly dictates otherwise. It should also be noted that the term "or" is generally employed in its sense including "and/or" unless the content clearly dictates otherwise.

As used in the specification and appended claims, the use of "correspond," "corresponds," and "corresponding" is intended to describe a ratio of or a similarity between referenced objects. The use of "correspond" or one of its forms should not be construed to mean the exact shape or size.

Throughout the specification, the term "layer" is used in its broadest sense to include a thin film, a cap, or the like, and one layer may be composed of multiple sub-layers.

Specific embodiments of chip packages are described herein; however, the present disclosure and the reference to certain materials, dimensions, and the details and ordering of processing steps are exemplary and should not be limited to those shown.

Figure 5:
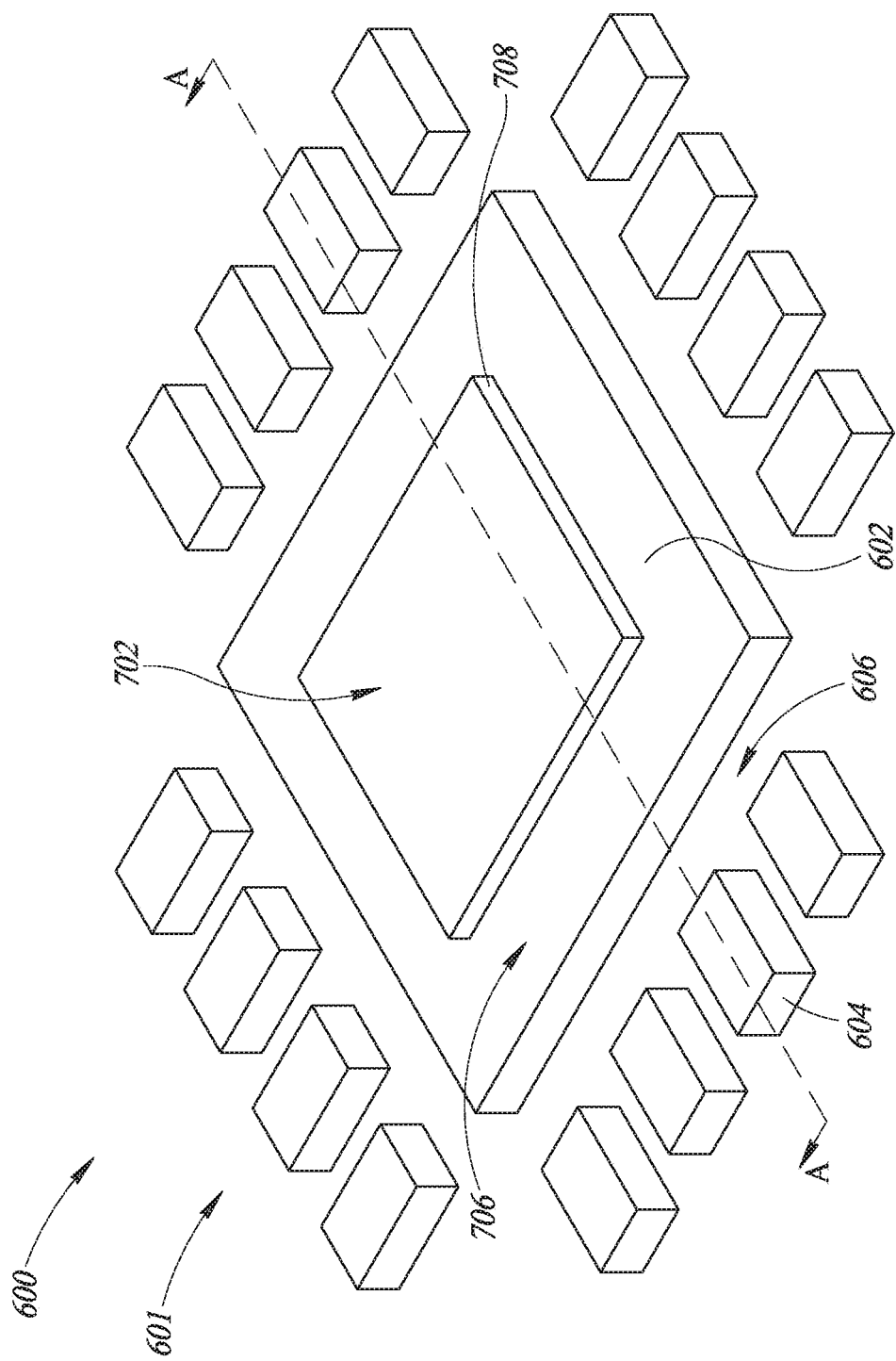
FIG. 5 is an isometric view of an exemplary leadframe having a recess around a perimeter of the main body.

The present disclosure is generally directed to chip packages, such as a chip package 600 shown in FIG. 5. The chip package 600 includes a leadframe 601 having a main body 602 with a top surface 702 and a lead 604 separated from the main body 602 of the leadframe 601 by a space 606. There is a recess 704 formed in the main body 602 of the leadframe 601 forming a die attach pad 708 in the main body 602 (see also FIG. 7). As a semiconductor die is positioned on the die attach pad 708, excess adhesive between the semiconductor die and the die attach pad 708 flow into the recess 704 covering a recess surface 706 instead of adhering to a side surface of the semiconductor die.

Figure 6:
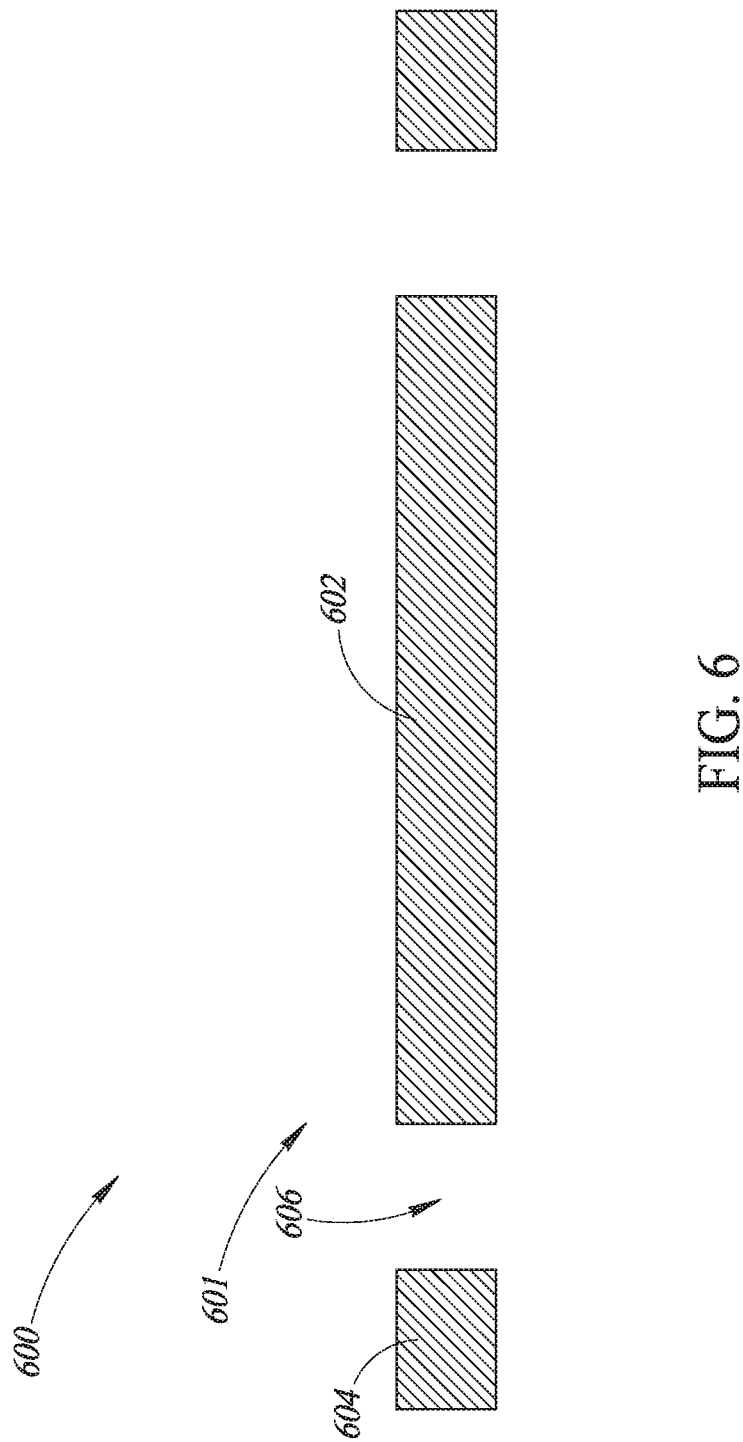
FIGS. 6 and 7 are cross-sectional views of an exemplary leadframe during various stages of a manufacturing process, with FIG. 7 being taken along line A-A of FIG. 5.
Figure 7:
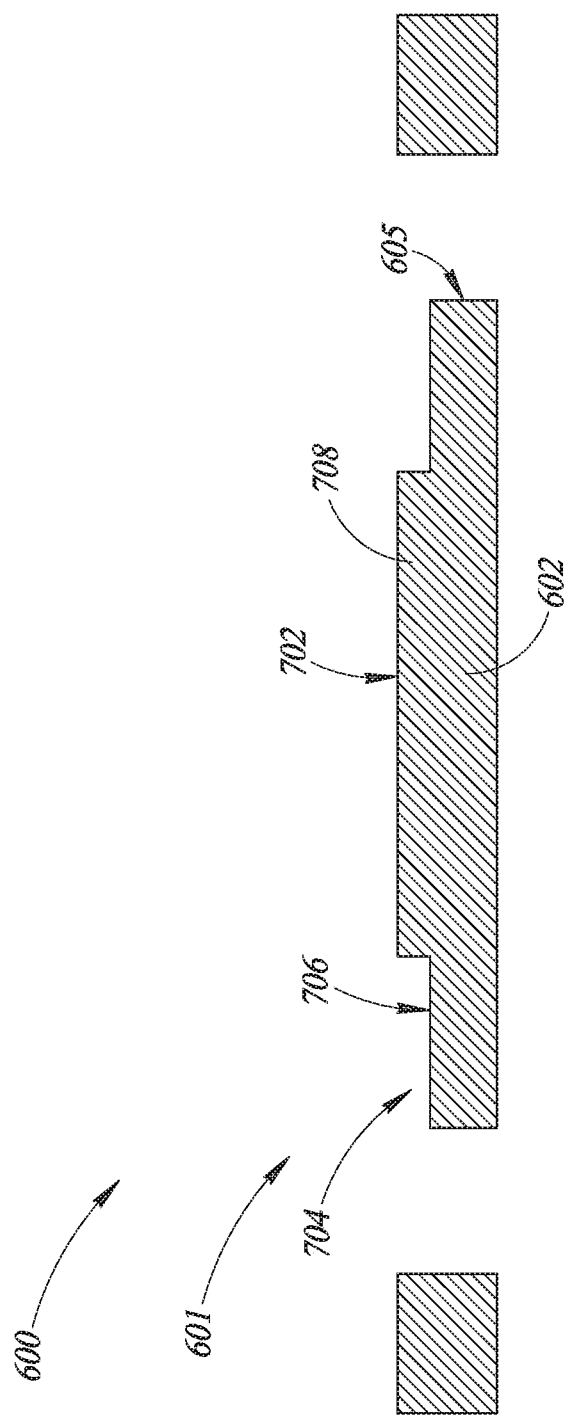
Figure 8:
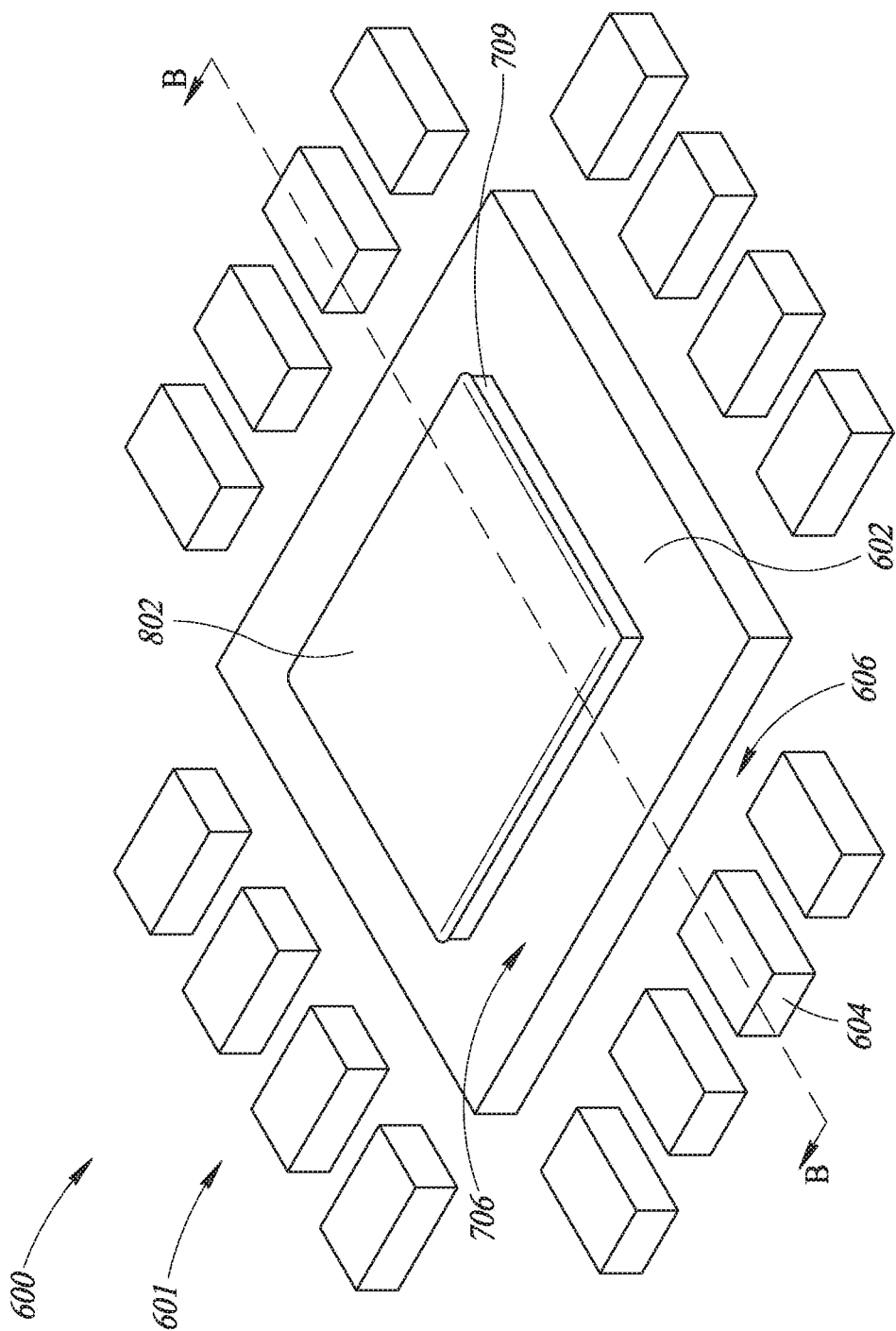
FIG. 8 is an isometric view of an exemplary leadframe at one stage of the manufacturing process.
Figure 9:
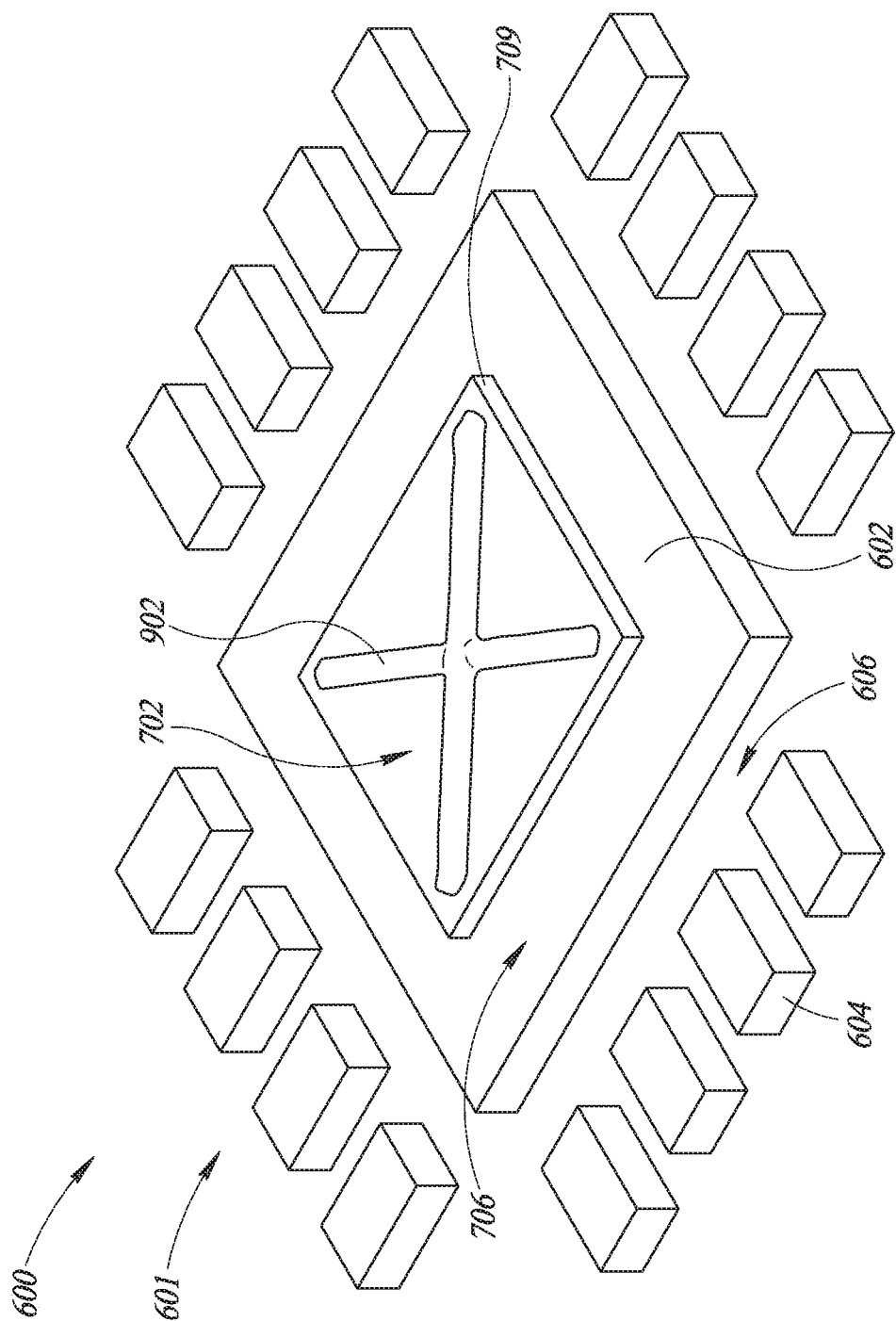
FIG. 9 is an isometric view of an alternate embodiment of an exemplary leadframe during a stage of the manufacturing process.
Figure 10:
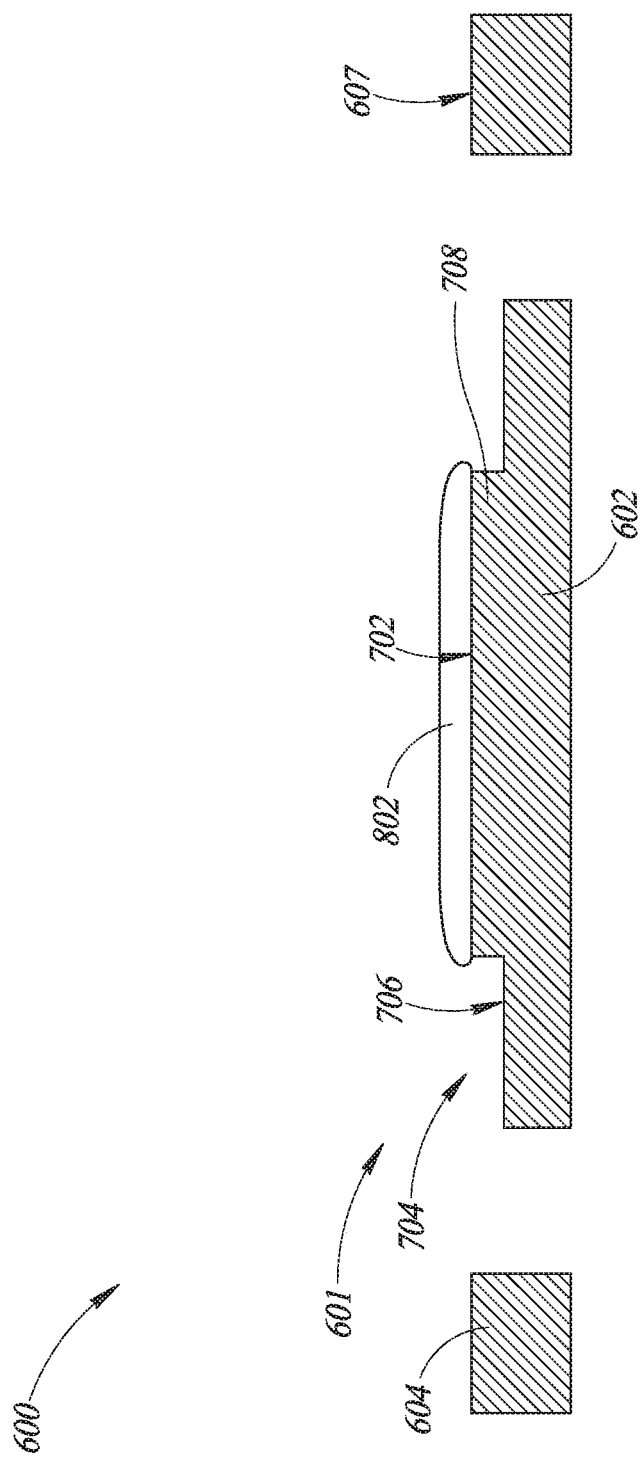
FIG. 10 is a cross-sectional view taken along line B-B of the exemplary leadframe shown in FIG. 8.
Figure 11:
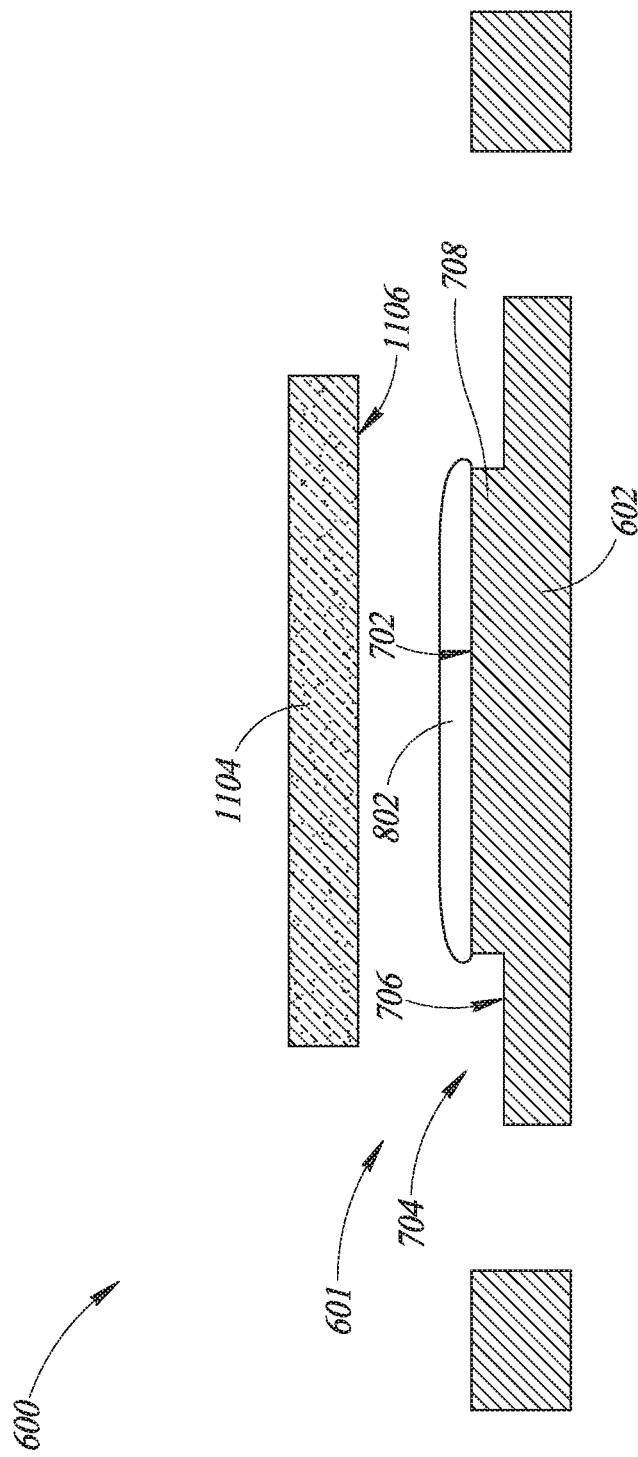
FIGS. 11-14 are cross-sectional views of an exemplary leadframe during various stages of the manufacturing process.
Figure 12:
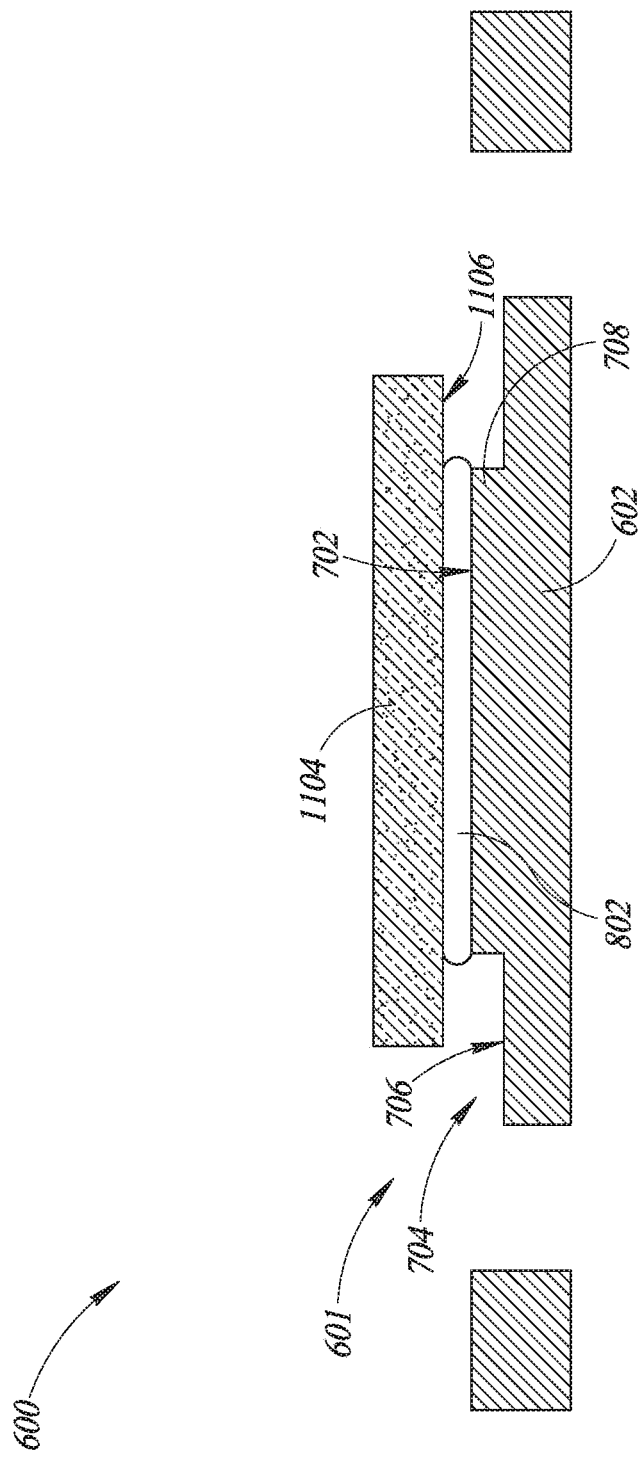
Figure 13:
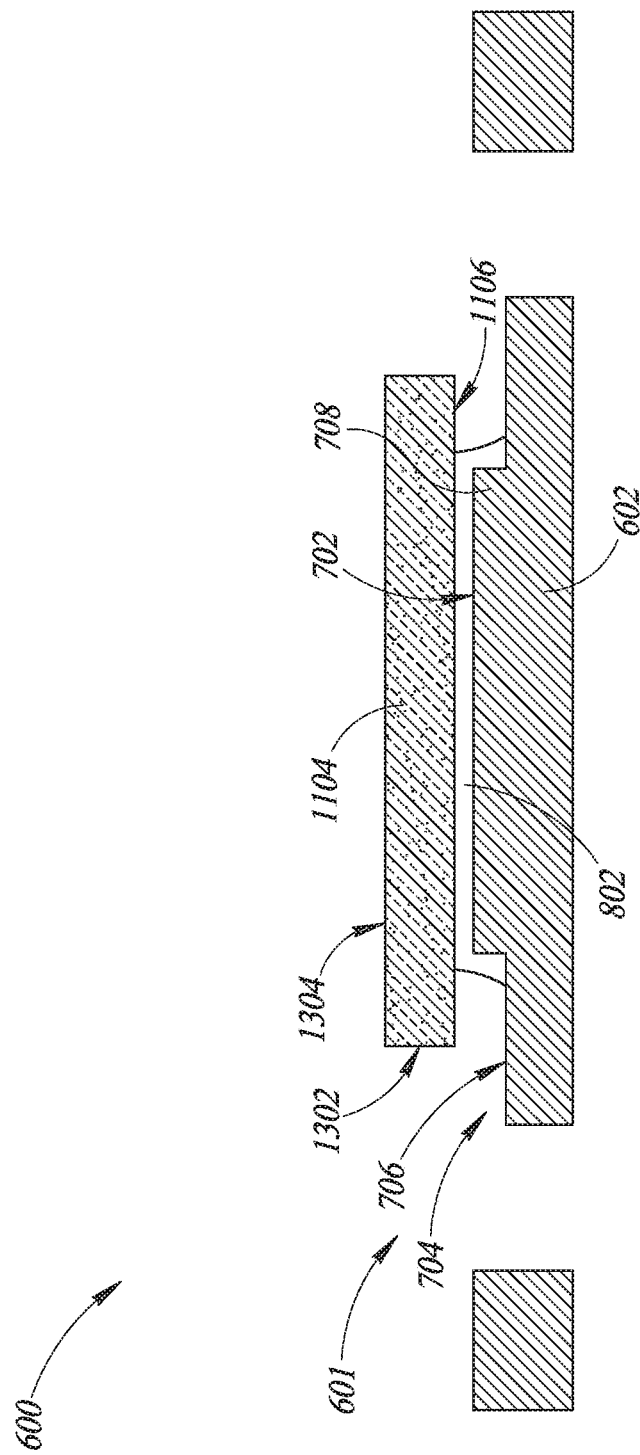
Figure 14:
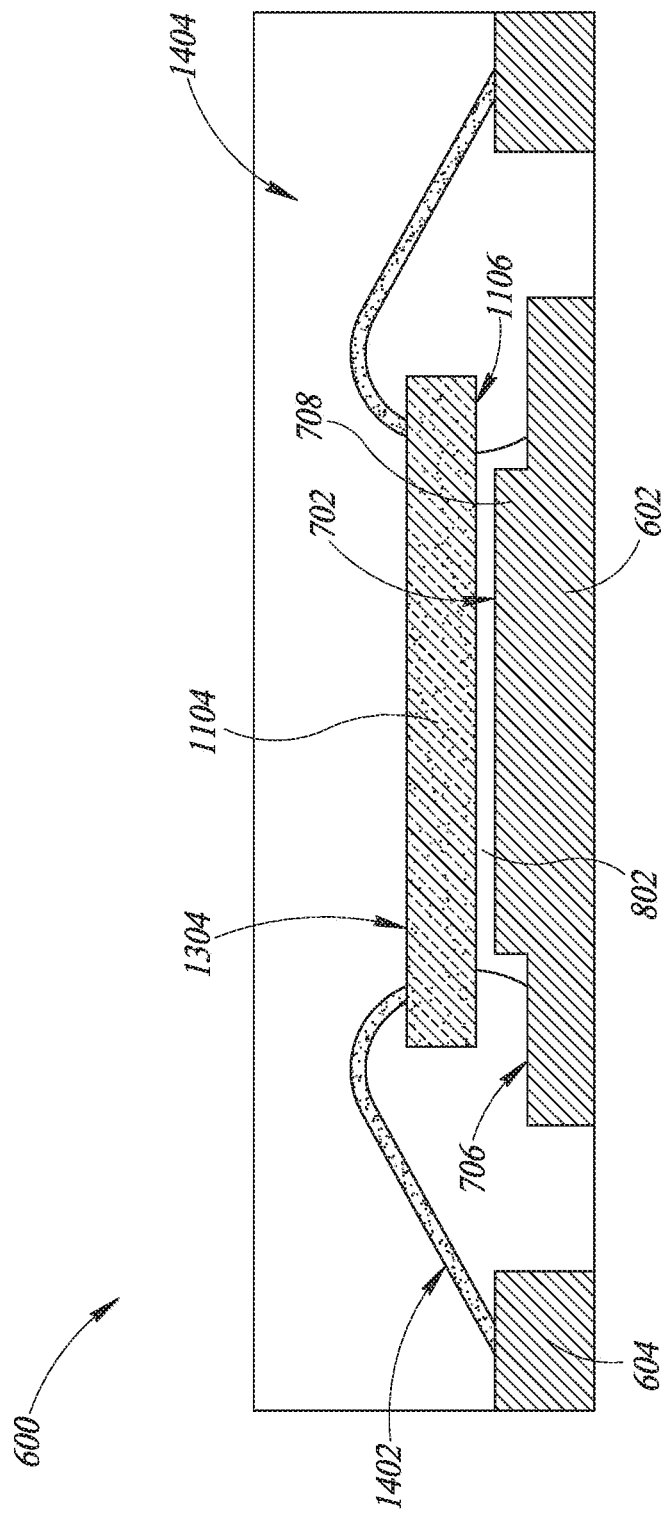

FIGS. 6-8 and 10-14 are views of a chip package in various stages of a manufacturing process. FIG. 14 represents one embodiment of a finished chip package, beginning with the leadframe shown in FIG. 6. FIG. 6 is a cross-sectional view of a leadframe with a main body and leads. FIG. 7 is a cross-sectional view of the leadframe of FIG. 5 taken at cross-section line A-A, with FIGS. 5 and 7 showing the leadframe of FIG. 6 after having recesses etched into a top surface of the main body. FIG. 8 is an isometric view of the leadframe of FIGS. 5 and 7 with an adhesive on the die pad on the main body. FIG. 9 is an isometric view of an alternate embodiment of FIG. 8 with a different pattern of adhesive on the die pad on the main body. FIG. 10 is a cross-sectional view of the leadframe of FIG. 8 taken at cross-section line B-B. FIGS. 11-13 are cross-sectional views of the die being positioned on the leadframe and the resulting behavior of the adhesive as it is compressed between the die and the leadframe. FIG. 14 is a cross-sectional view of the chip package of FIG. 13 after being surrounded by encapsulant. FIGS. 15-21 depict isometric and cross-sectional views of alternate embodiments of chip packages of the present disclosure with a single recess around a perimeter of the main body. FIGS. 22-25 depict isometric and cross-sectional views of alternate embodiments of chip packages of the present disclosure with multiple recesses on the main body of the leadframe.

As represented in the cross-sectional view of FIG. 6, assembly of the chip package 600 begins with a leadframe 601. The leadframe 601 includes a main body 602 and a lead 604 separated from the main body 602 by a space 606. The space 606 may be etched in the leadframe 601 or the leadframe 601 may be formed with the space 606. Typically at this point in the manufacturing process the lead 604 is still mechanically joined to the main body 602 by a support bar, stringer or other elements, which are not shown since they are well known in the art. The leadframe 601 may be made or plated with any number of materials, including copper and copper alloys. In some embodiments, the leadframe 601 has a maximum thickness of 200 micrometers of the main body 602, the lead 604, or both.

FIG. 7 is a cross-sectional view of the chip package 600 after an etching step. FIG. 7 represents a cross-sectional view of the chip package 600 shown in FIG. 5, taken at cross-section line A-A. The main body 602 of the leadframe 601 has a top surface 702 that is partially etched away. The partial etching removes only a portion of the top surface 702 and the main body 602 to create a recess 704 that does not penetrate through the entire thickness of the main body 602. In some embodiments, a depth of the recess 704 is less than half of the maximum thickness of the main body 602. In other embodiments, the depth of the recess 704 is more than half of the maximum thickness of the main body 602. The shape of the recess 704 may be rectangular, elliptical, irregular, or any other shape.

The recess 704 may be anywhere along the top surface 702. As can be appreciated from FIG. 7, in some embodiments the recess 704 overlaps an edge 605 of the main body 602. In other embodiments, the recess 704 is positioned in the interior of the top surface 702 on the main body 602. And in some embodiments, there may be more than one recess 704 or the recess 704 may extend around the top surface such that a single recess appears as more than one recess in a cross-sectional view, such as two, three, four, or more recesses. In other embodiments, the recess 704 forms a recess or channel in the main body 602. In some embodiments, the recess 704 forms a die pad 708 underneath the remaining top surface 702 on the main body 602 of the leadframe 601. The top surface 702 has a surface area greater than or equal to a surface area of a recess surface 706, in some embodiments. In other embodiments, the top surface 702 has a surface area less than a surface area of the recess surface 706. As can be appreciated with reference to FIG. 5, the recess surface 706 is depicted extending around four sides of the main body 602. In other embodiments, the recess surface 706 extends around more or less sides of the main body 602. FIG. 5 depicts the chip package as a 16 pin quad-flat no-leads package; however, other chip packages are used in other embodiments. For example, a chip package with a different pin count is used in some embodiments. Additionally, a different chip package type may be used, such as a quad flat package, leadless chip carrier, pin grid array, ball grid array, land grid array, and through-hole chip packages.

FIG. 8 is an isometric view of one embodiment after applying an adhesive to the leadframe of FIG. 5. In FIG. 8, an adhesive 802 is applied uniformly over the entire top surface of the die pad 708, with the adhesive slightly extending over edges 709 of the top surface. The adhesive 802 may be any acceptable type of those commonly used in the semiconductor industry that exhibits a fluid characteristic at any point during the manufacturing process. For example, the adhesive 802 can be a sintering glue, a semi-sintering glue, or an epoxy, in some embodiments. As is known, the adhesive may include any type and amount of conductive fillings to make it more electrically conductive, such as a silver material for example.

FIG. 9 is an isometric view of an alternate embodiment of the step of applying the adhesive to the leadframe of FIG. 5. In FIG. 9, an adhesive 902 is applied to the top surface 702 of the die pad 708 as two crossing lines from corners of the top surface 702. Other embodiments have different amounts or different patterns of adhesive applied to a leadframe, to a die, or to both.

FIG. 10 is a cross-sectional view of the chip package shown in FIG. 8 taken at cross-section line B-B. The adhesive 802 covers the top surface 702 of the die pad 708. The embodiment of FIG. 10 shows that the adhesive 802 extends over sides of the die pad 708. In other embodiments the adhesive 802 only covers a portion of the die pad 708. As can be appreciated from FIG. 10, some embodiments have the top surface 702 of the die pad 708 coplanar with a top 607 of the lead 604 and in other embodiments the top 607 of the lead 604 is coplanar with the recess surface 706. In yet other embodiments, the top of the lead 604 is not coplanar with either the recess surface 706 or the top surface 702 of the die pad 708.

FIG. 11 is a cross-sectional view of the chip package 600 with a die 1104 positioned to be placed on the die pad 708, after an adhesive application step. As discussed with respect to FIG. 8, the adhesive 802 may cover the entire top surface 702 of the die pad 708, and may extend beyond the edges of the top surface 702. The semiconductor die 1104 is then aligned over the die pad 708 to be positioned on the die pad 708 and secured using the adhesive 802 that will contact a bottom surface 1106 of the semiconductor die 1104. In one embodiment a width of the die pad 708 is less than a width of the semiconductor die 1104. For example, in one embodiment, the footprint area of the die pad, while less than the footprint area of the semiconductor die 1104, is more than 80% of the footprint area of the semiconductor die 1104. For example, a leadframe with a thickness of 200 μm and a width of about 900 μm would have the semiconductor die 1104 extend between 60 μm and 160 μm over the recess 704, the recess 704 having a width of 300 μm and a depth of 160 μm. In one embodiment, the semiconductor die 1104 extends 110 μm over the recess 704. In another embodiment, the depth of the recess is in the range of 120 μm and, thus, greater than half the total thickness of the main body 602 of the leadframe 601.

FIG. 12 is a cross-sectional view of the chip package 600 at an intermediate step of attaching the semiconductor die 1104 to the leadframe 601. The semiconductor die 1104 is moved towards the leadframe 601 and the bottom surface 1106 of the semiconductor die 1104 contacts the adhesive 802 on the top surface 702 of the die pad 708. The semiconductor die 1104 continues to move towards the leadframe 601 from compressive forces, causing the adhesive 802 to push towards the sides of the die pad 708.

Figure 1:
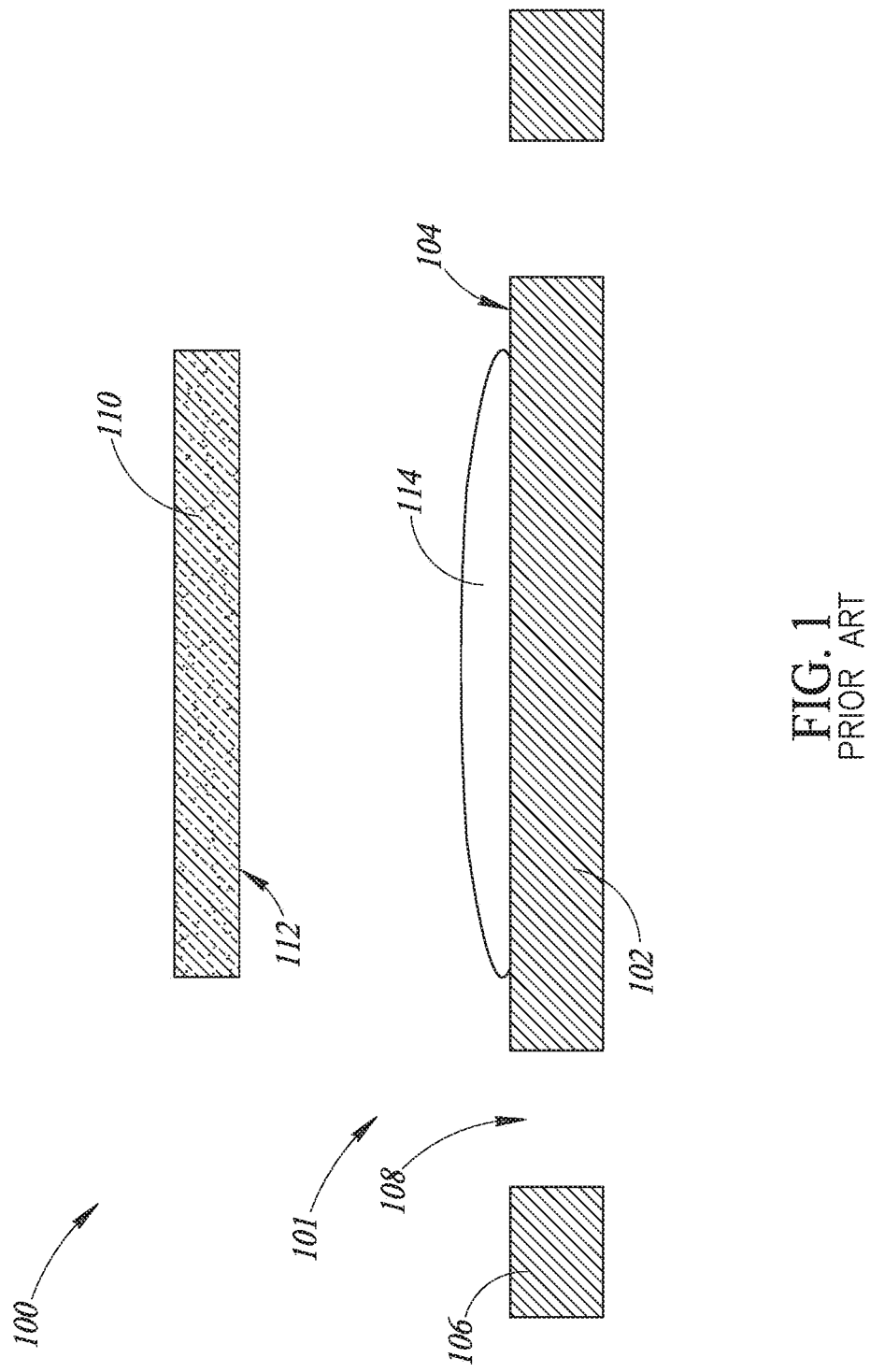
FIGS. 1-4 are cross-sectional views of a leadframe during various stages of a manufacturing process, as is known in the prior art.
Figure 2:
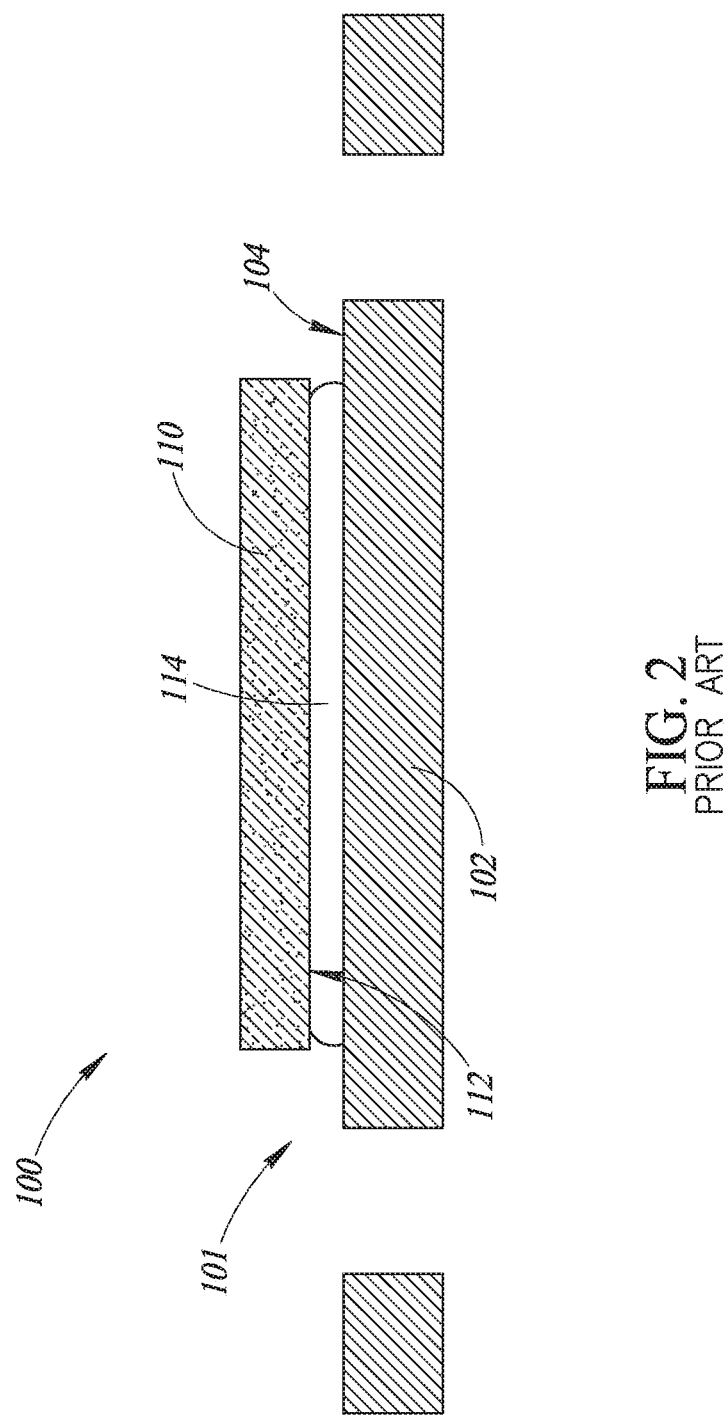
Figure 3:
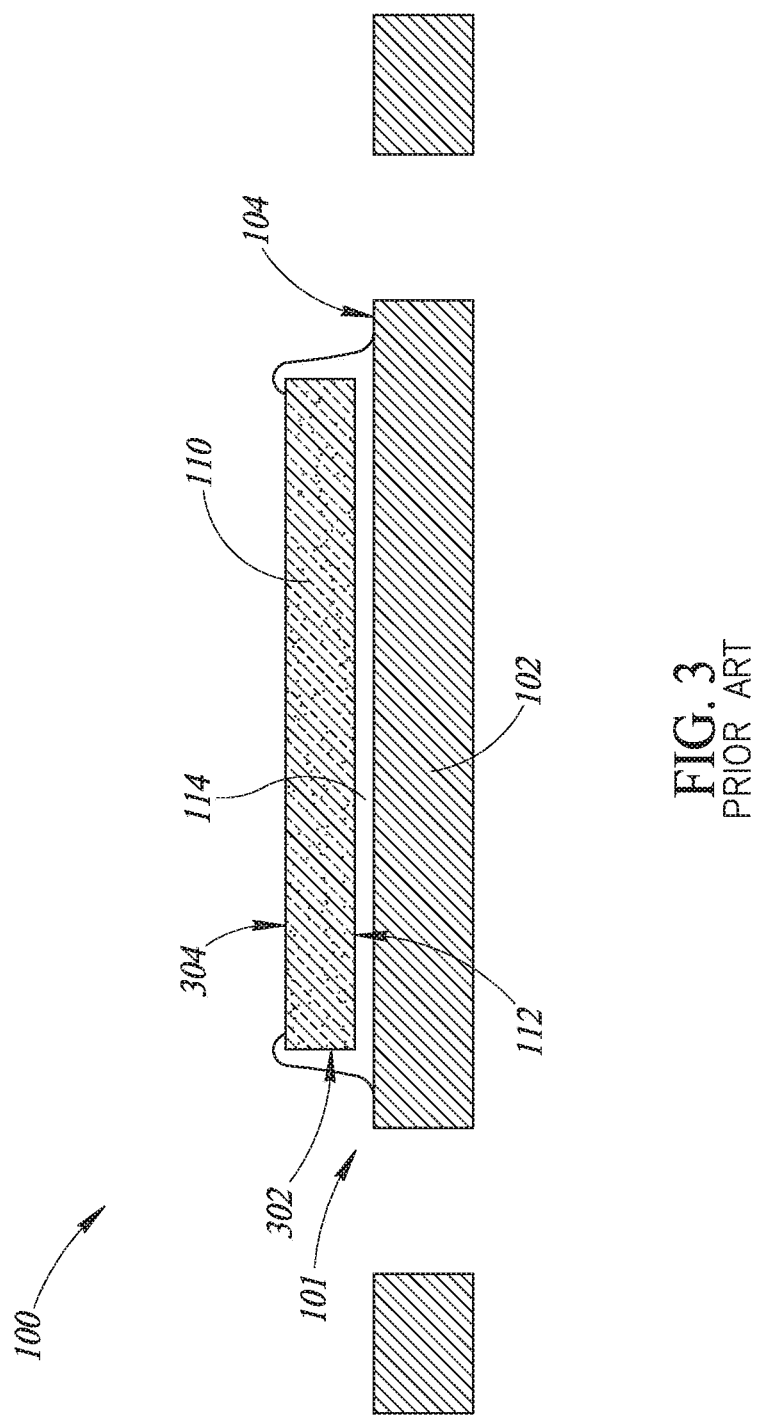
Figure 4:
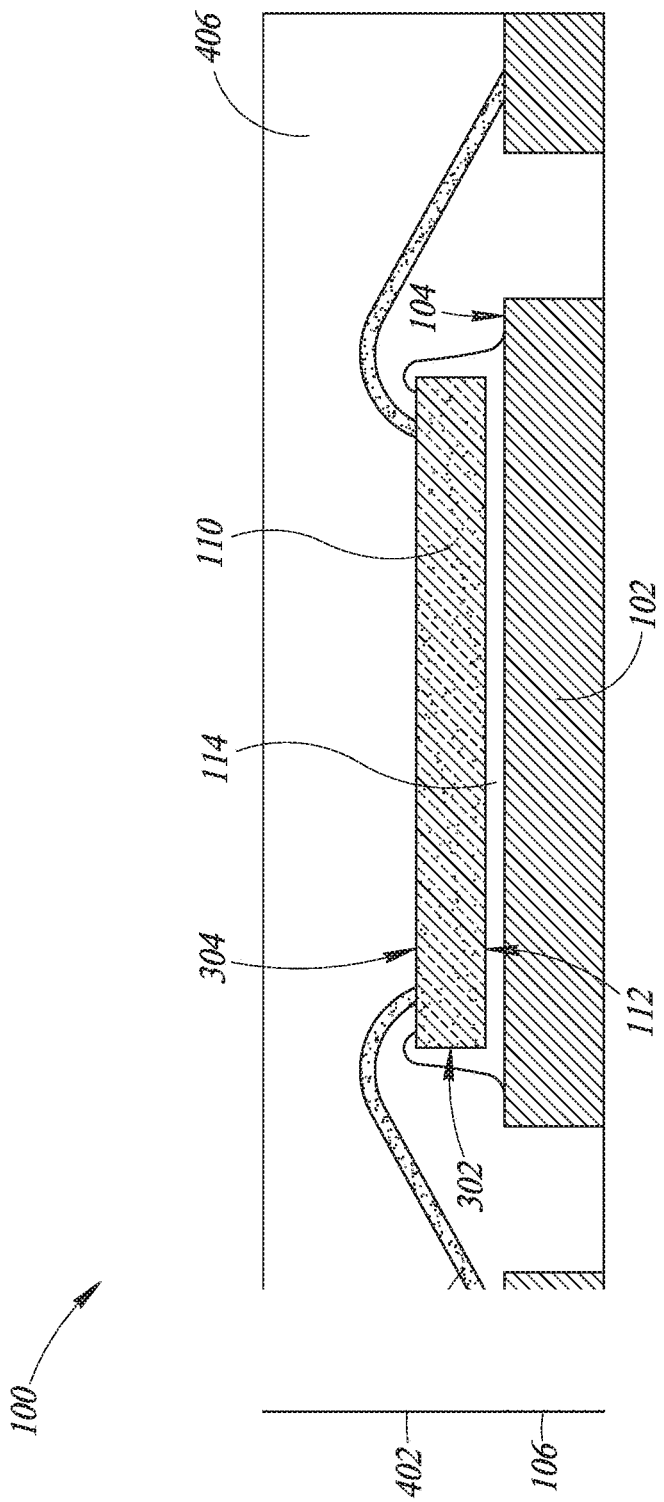

FIG. 13 is a cross-sectional view of the chip package 600 with the semiconductor die 1104 in a final position on the main body 602 of the leadframe 601. As shown in FIG. 13, the adhesive 802 has been pushed to the sides of the die pad 708 by the compressive forces on the semiconductor die 1104 and the main body 602. In one embodiment, the adhesive has partially filled the recess 704 and covered a portion of the recess surface 706. The recess serves as an overfill reservoir or catch basin for the adhesive 802. Compared to the prior art shown in FIG. 3, the compressive forces applied during manufacturing have not caused the adhesive 802 to creep up a side surface 1302 and a top surface 1304 of the semiconductor die 1104. In contrast, any excess adhesive 802 is collected in the recess 704. The overfill reservoir of the recess 704 allows greater tolerances in the amount of die attach adhesive that is applied to the leadframe 601, as a greater amount of excess adhesive can be applied without negatively affecting the performance of the final product.

To prevent any tendency for the adhesive 802 to flow or bleed out from between the semiconductor die 1104 and the main body 602, a portion of the recess surface 706 may be roughened. The roughening of a portion of the recess surface 706 may promote non-wettability of the adhesive 802 at the rough surface, stopping or slowing the tendency of the adhesive 802 to flow at the rough surface.

In the embodiment of FIG. 13, the die 1104 is shown as having approximately the same thickness as the portion of the main body 602 below the recess 704. In many embodiments, the die 1104 will be thinner than the main body 602. Current designs often have very thin dies and, thus, leadframes to provide ultra-thin packages. Therefore, in some embodiments, the die may be only 40-60 μm thick or even thinner. In other embodiments, it might be over 200-300 μm thick and, thus, be thicker than the main body 602 of the leadframe 601.

FIG. 14 is a cross-sectional view of the chip package 600 after encapsulation. The semiconductor die 1104 is electrically coupled to the lead 604 by a bond wire 1402. Then the entire assembly is encapsulated in an encapsulant 1404. The encapsulant surrounds the semiconductor die 1104 and fills the recess 704. The encapsulant 1404 is a molding compound, in some embodiments. In other embodiments the encapsulant 1404 is any material that provides electrical insulation between the different leads, bond wires, and semiconductor die contacts. In some embodiments, the encapsulant 1404 is an electrical insulator and a thermal conductor. In some embodiments, one side of the main body 602 is exposed through one side of the encapsulant 1404. In those embodiments, the main body 602 may provide electrical or thermal coupling between the semiconductor die 1104 and an external contact. In some embodiments, one or more sides of the lead 604 are exposed through one or more sides of the encapsulant 1404 6 to provide an electrical coupling between the semiconductor die 1104 and an external contact.

Figure 15:
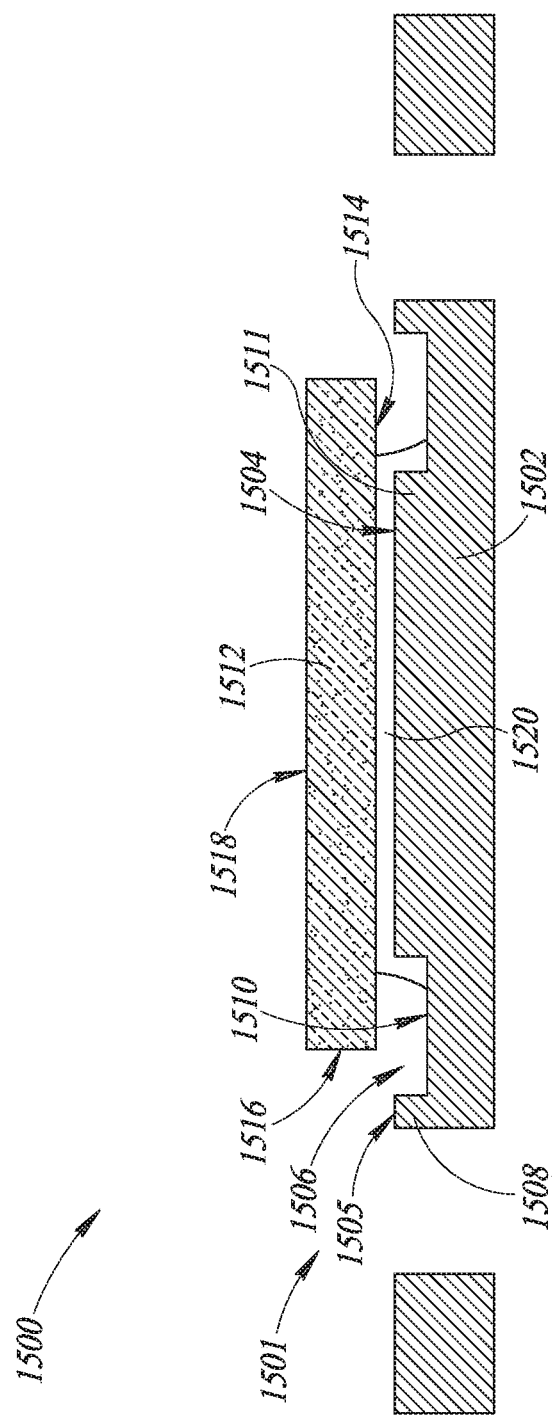
FIG. 15 is a cross-sectional view of an alternate embodiment of an exemplary leadframe having recesses and anchors.

FIG. 15 is a cross-sectional view of a chip package 1500 with encapsulant anchors 1508. Similar to the packages described above, the chip package 1500 includes a leadframe 1501 including a main body 1502, the main body 1502 having a top surface that is split into a top surface 1504 and a top surface 1505 by a recess 1506, and the recess 1506 having a recess surface 1510. In some embodiments the top surface 1504 and the top surface 1505 are in the same plane. In other embodiments, the top surface 1504 and the top surface 1505 are not in the same plane. A die pad 1511 on the main body 1502 supports a semiconductor die 1512. The semiconductor die 1512 has a bottom surface 1514, a side surface 1516, and a top surface 1518. Between the bottom surface 1514 of the semiconductor die 1512 and the top surface 1504 of the die pad 1511 is an adhesive 1520 that couples the semiconductor die 1512 to the leadframe 1501.

The adhesive 1520 is compressed between the semiconductor die 1512 and the die pad 1511 such that excess adhesive is pushed to the sides of the die pad 1511 and partially fills the recess 1506. The remainder of the recess 1506 is available to receive encapsulant at a later step of the manufacturing process.

The recess 1506 is shown having three sides enclosed and one side open through a plane of the top surface 1504 or 1505. The recess of FIGS. 15 and 16 may be provided in the form of a trench or a grove in the leadframe 1502, 1602. In this embodiment, a portion of the main body 1502 of the leadframe 1501 forms an anchor 1508. The anchor 1508 is surrounded by an encapsulant at a later step of the manufacturing process and increases the strength of the mechanical coupling between the leadframe 1501 and the encapsulant. Delamination of the encapsulant from the leadframe 1501 may be induced by mechanical, thermal, or other stresses. The increased strength of the mechanical coupling helps prevent delamination of the encapsulant from the leadframe 1501 under those stresses. In one embodiment, the width of the anchor 1508 is 100 µm. The recess 1506 also serves to block moisture ingress to the die 1512 by providing a serpentine path of extended length moisture must travel to reach the die from outside of the package. The moisture, if it enters the package, tends to get trapped on an internal corner of anchor 1508, preventing it from reaching the die 1512.

Figure 16:
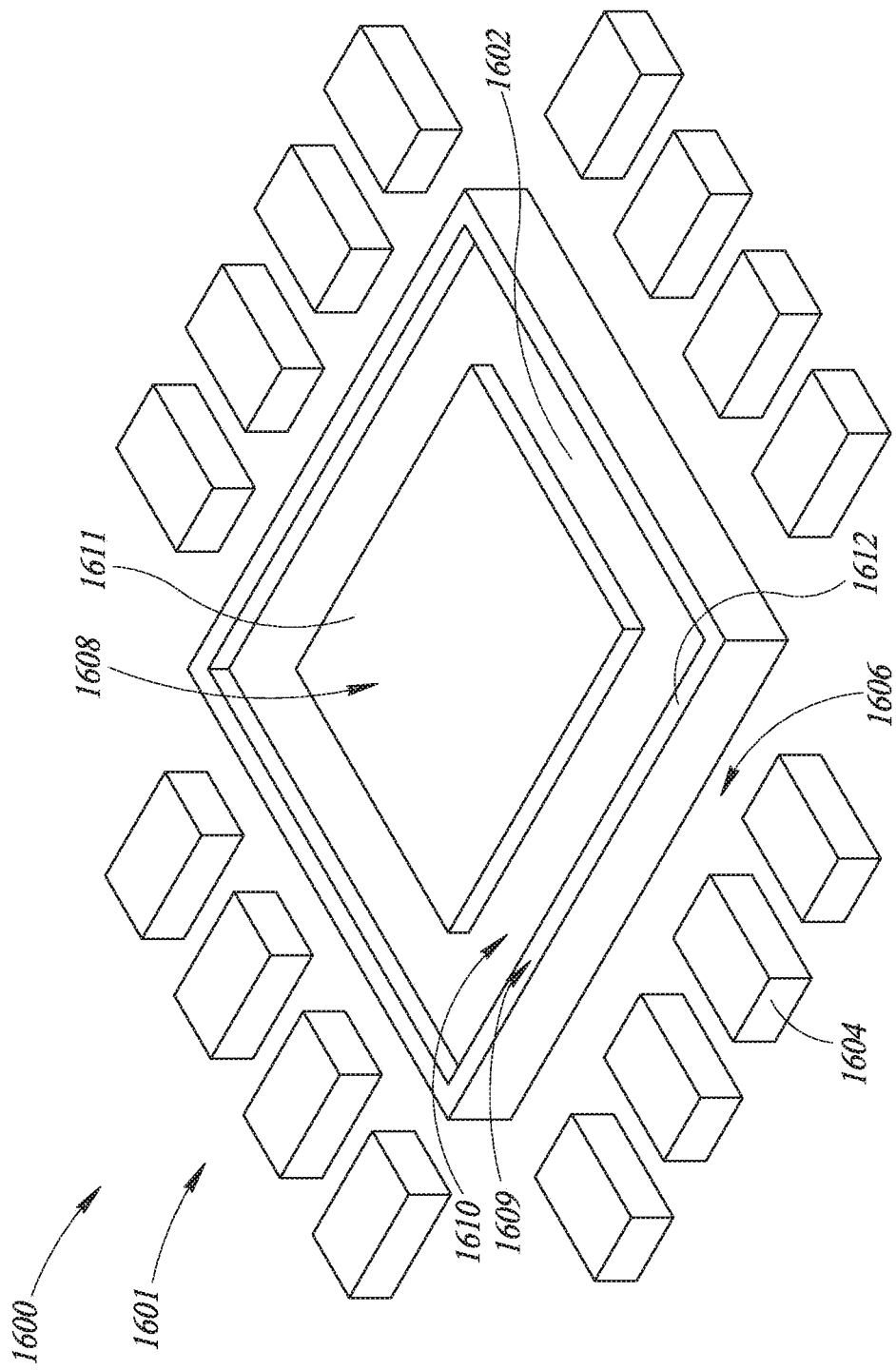
FIGS. 16 and 17 are isometric views of alternate embodiments of an exemplary leadframe.
Figure 17:
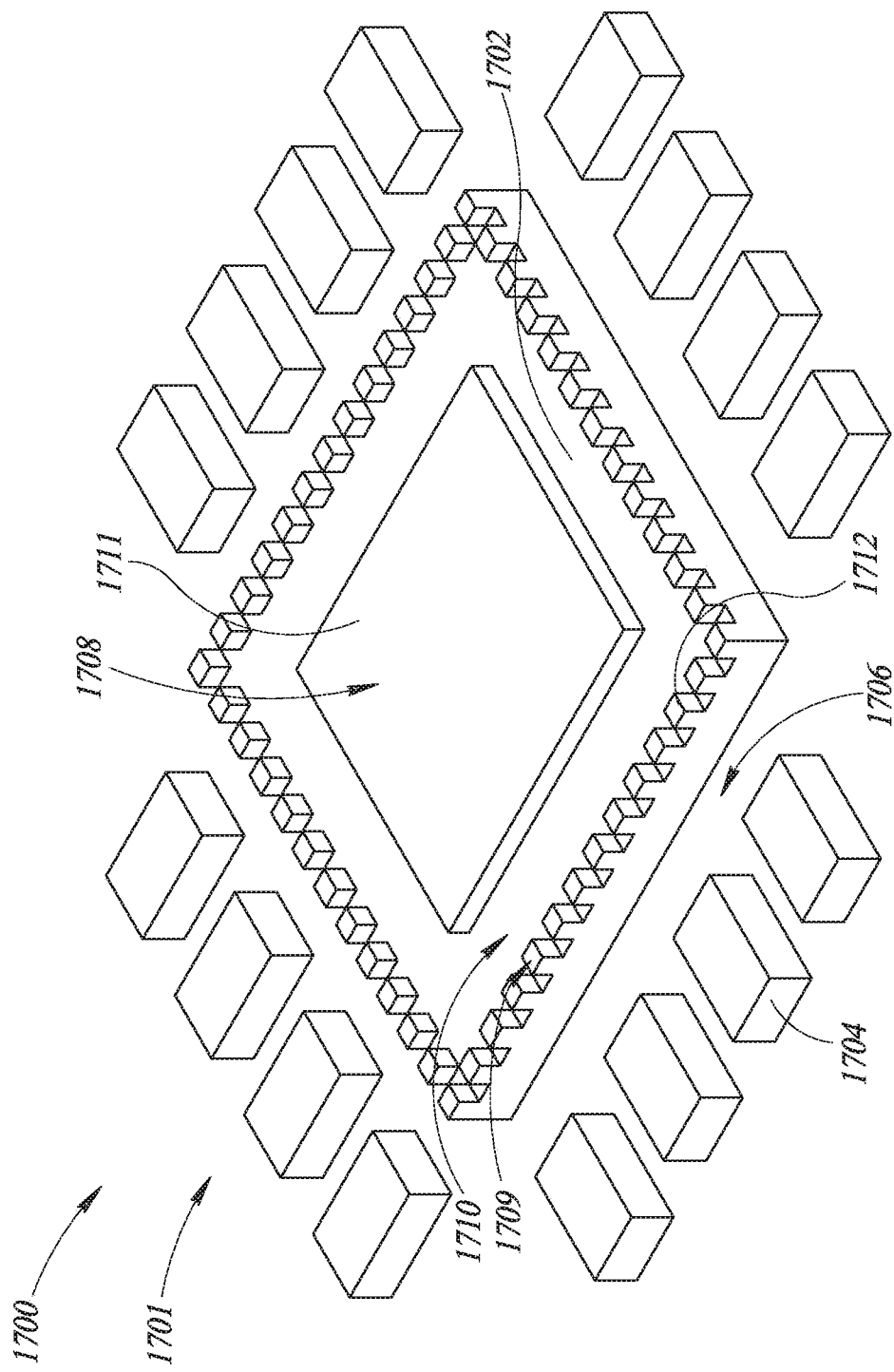

FIGS. 16 and 17 are isometric views of alternate embodiments having a cross-section shown in FIG. 15. Similar to the packages described above, a chip package 1600 includes a leadframe 1601 including a main body 1602 and a lead 1604 separated from the main body 1602 by space 1606. The main body 1602 has a top surface that is split into a top surface 1608 and a top surface 1609 by a recess having a recess surface 1610. In some embodiments the top surface 1608 and the top surface 1609 are in the same plane. In other embodiments, the top surface 1608 and the top surface 1609 are not in the same plane. The recess forms a die pad 1611 on the main body 1602. In later steps of the manufacturing process, a semiconductor die is positioned on the die pad 1611 and secured with an adhesive that couples the semiconductor die to the leadframe 1601.

As shown in FIG. 16, one embodiment of the device depicted in FIG. 15 has a rectangular recess through a plane defined by the top surface 1608 or the top surface 1609 of the main body 1602. In this embodiment, the recess forms an anchor 1612 between the space 1606 and the recess. The anchor 1612 is surrounded by an encapsulant at a later step of the manufacturing process and increases the strength of the mechanical coupling between the leadframe 1601 and the encapsulant. In other embodiments, the anchor 1612 may extend around less than four sides of the main body 1602, and may not extend over an entire length of any single side. The recess is depicted having rectangular shaped etching; however, other etching shapes are possible, including irregular shapes. Additionally, a portion of the recess surface 1610 may be roughened.

Similar to the packages described above, a chip package 1700 includes a leadframe 1701 including a main body 1702 and a lead 1704 separated from the main body 1702 by a space 1706. The main body 1702 has a top surface that is split into a top surface 1708 and a top surface 1709 by a recess having a recess surface 1710. In some embodiments the top surface 1708 and the top surface 1709 are in the same plane. In other embodiments, the top surface 1708 and the top surface 1709 are not in the same plane. The recess forms a die pad 1711 on the main body 1702. In later steps of the manufacturing process, a semiconductor die is positioned on the die pad 1711 and secured with an adhesive that couples the semiconductor die to the leadframe 1701.

As shown in FIG. 17, one embodiment of the device depicted in FIG. 15 has a rectangular recess through a plane defined by the top surface 1708 or the top surface 1709 of the main body 1702. In this embodiment, the recess forms an anchor 1712 between the space 1706 and the recess. The anchor 1712 is surrounded by an encapsulant at a later step of the manufacturing process and increases the strength of the mechanical coupling between the leadframe 1701 and the encapsulant. In other embodiments, the anchor 1712 may extend around less than four sides of the main body 1702, and may not extend over an entire length of any single side. The recess is depicted having rectangular shaped etching; however, other etching shapes are possible, including irregular shapes. Additionally, a portion of the recess surface 1710 may be roughened.

In contrast to the anchor 1612 shown in FIG. 16, anchor 1712 has a merlon and crenel pattern, wherein the posts having tops at the top surface 1709 are merlons and the spaces between the posts are crenels. A bottom surface of the crenel is coplanar with the recess surface 1710, in some embodiments. In other embodiments, the crenel is not coplanar with the recess surface 1710. Walls of the merlons adjacent to the crenels may be planar in some embodiments and may be curved in other embodiments. The merlons have a height from the surface of the crenel to the top surface 1709, a length along the line of the merlon and crenel pattern, and a width from the space 1706 to the recess. In some embodiments, the height, length, and width of the merlon are equal. In other embodiments, the height is greater than the length or the width of the merlon. In some embodiments, the length of the merlon is the same as a length of the crenel. In other embodiments, the length of the merlon is different than the length of the crenel.

Figure 18:
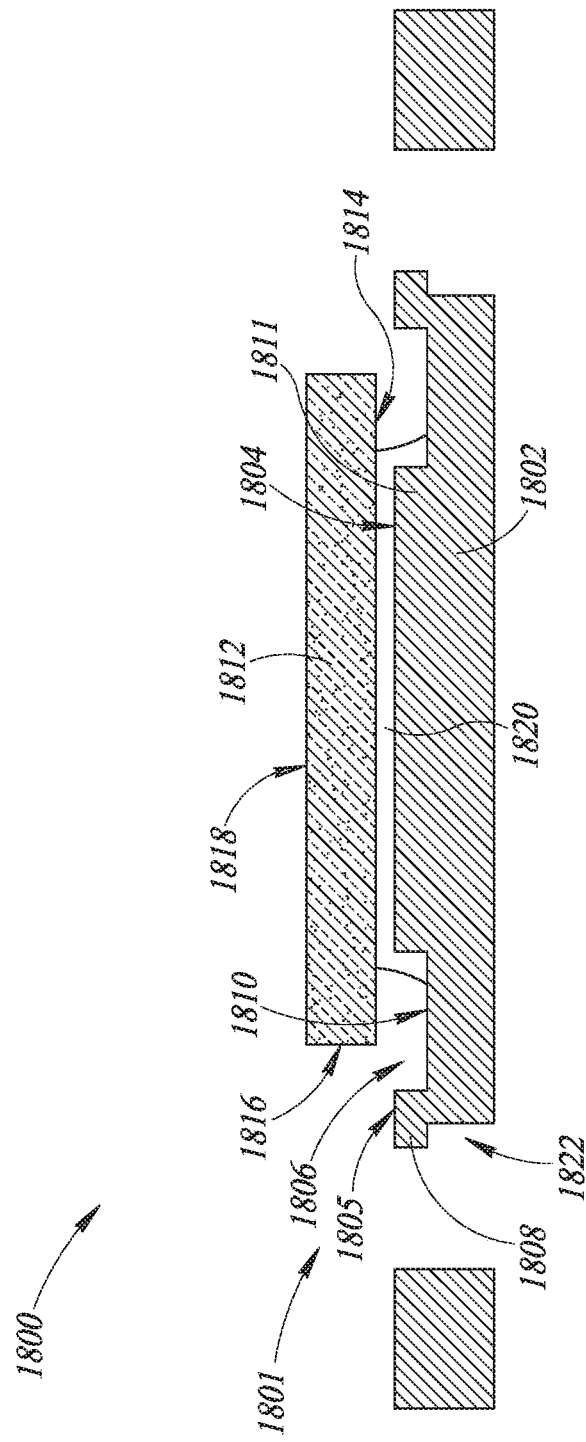
FIG. 18 is a cross-sectional view of an alternate embodiment of an exemplary leadframe having recesses and anchors.

FIG. 18 is a cross-sectional view of a chip package 1800 with encapsulant anchors with an overhang. Similar to the packages described above, the chip package 1800 includes a leadframe 1801 including a main body 1802, the main body 1802 having a top surface that is split into a top surface 1804 and a top surface 1805 by a recess 1806, and the recess 1806 having a recess surface 1810. In some embodiments the top surface 1804 and the top surface 1805 are in the same plane. In other embodiments, the top surface 1804 and the top surface 1805 are not in the same plane. The recess 1806 forms a die pad 1811 on the main body 1802, which supports a semiconductor die 1812. The semiconductor die 1812 has a bottom surface 1814, a side surface 1816, and a top surface 1818. Between the bottom surface 1814 of the semiconductor die 1812 and the top surface 1804 of the die pad 1811 is an adhesive 1820 that couples the semiconductor die 1812 to the leadframe 1801.

The adhesive 1820 is compressed between the semiconductor die 1812 and the die pad 1811 such that excess adhesive is pushed to the sides of the die pad 1811 and partially fills the recess 1806. The remainder of the recess 1806 is available to receive encapsulant at a later step of the manufacturing process. The recess 1806 is as described above with respect to FIGS. 15-17. In addition, a recess 1822 is etched in a side opposite the top side 1805. The recesses 1806 and 1822 form an anchor 1808 having an overhang extending away from the main body 1802. The anchor 1808 is surrounded by an encapsulant at a later step of the manufacturing process and increases the strength of the mechanical coupling between the leadframe 1801 and the encapsulant due to interlocking of the anchor 1808 and the encapsulant, and due to increased surface area between the two materials. Delamination of the encapsulant from the leadframe 1801 may be induced by mechanical, thermal, or other stresses. The increased strength of the mechanical coupling helps prevent delamination of the encapsulant from the leadframe 1801 under those stresses. This shape of anchor 1808 provides an increased path for moisture to travel form outside the package, thus additional protection than other designs. In one embodiment, the width of the anchor 1808 is 200 μm.

Figure 19:
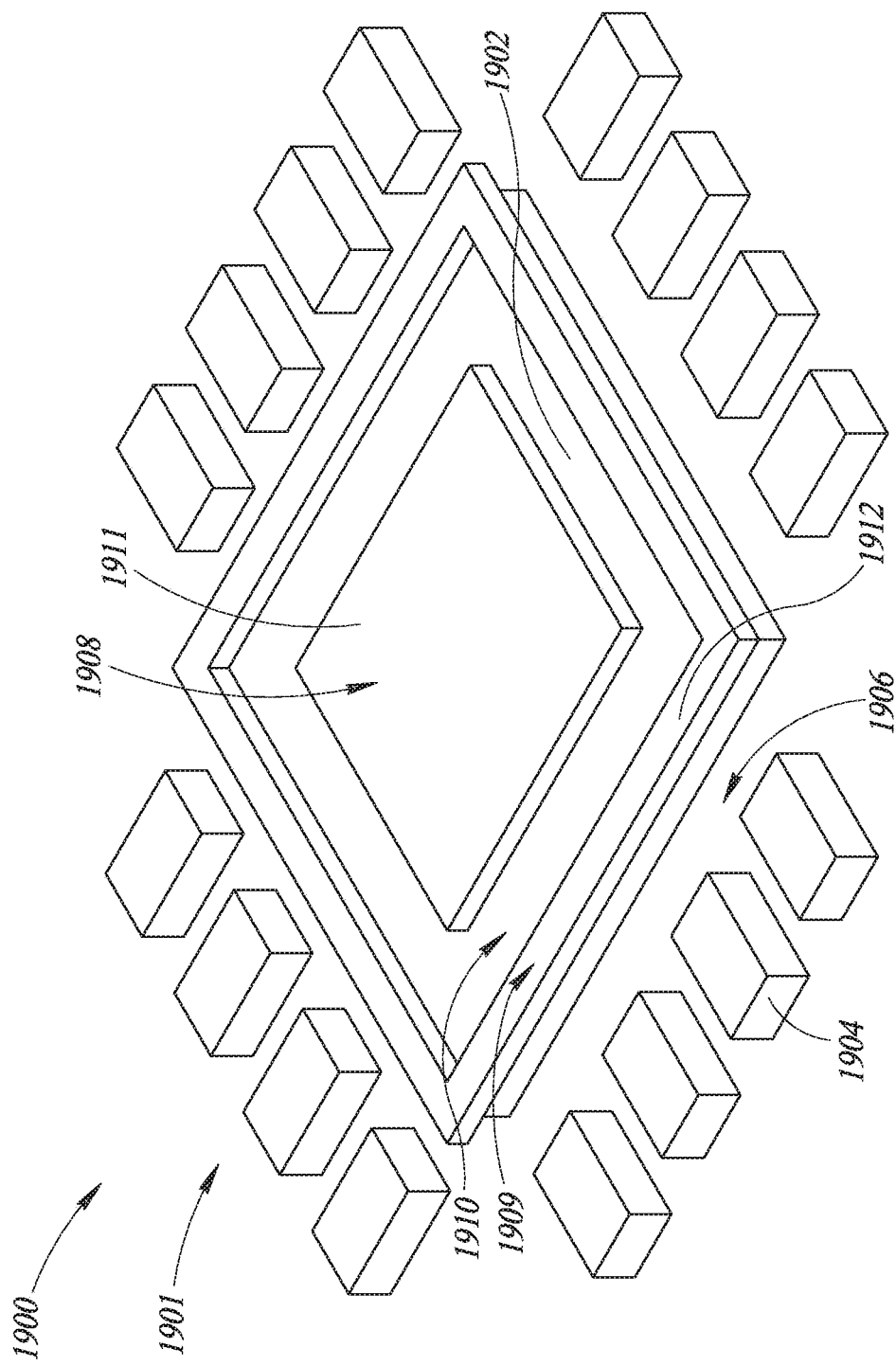
FIGS. 19 and 20 are isometric views of alternate embodiments of an exemplary leadframe.
Figure 20:
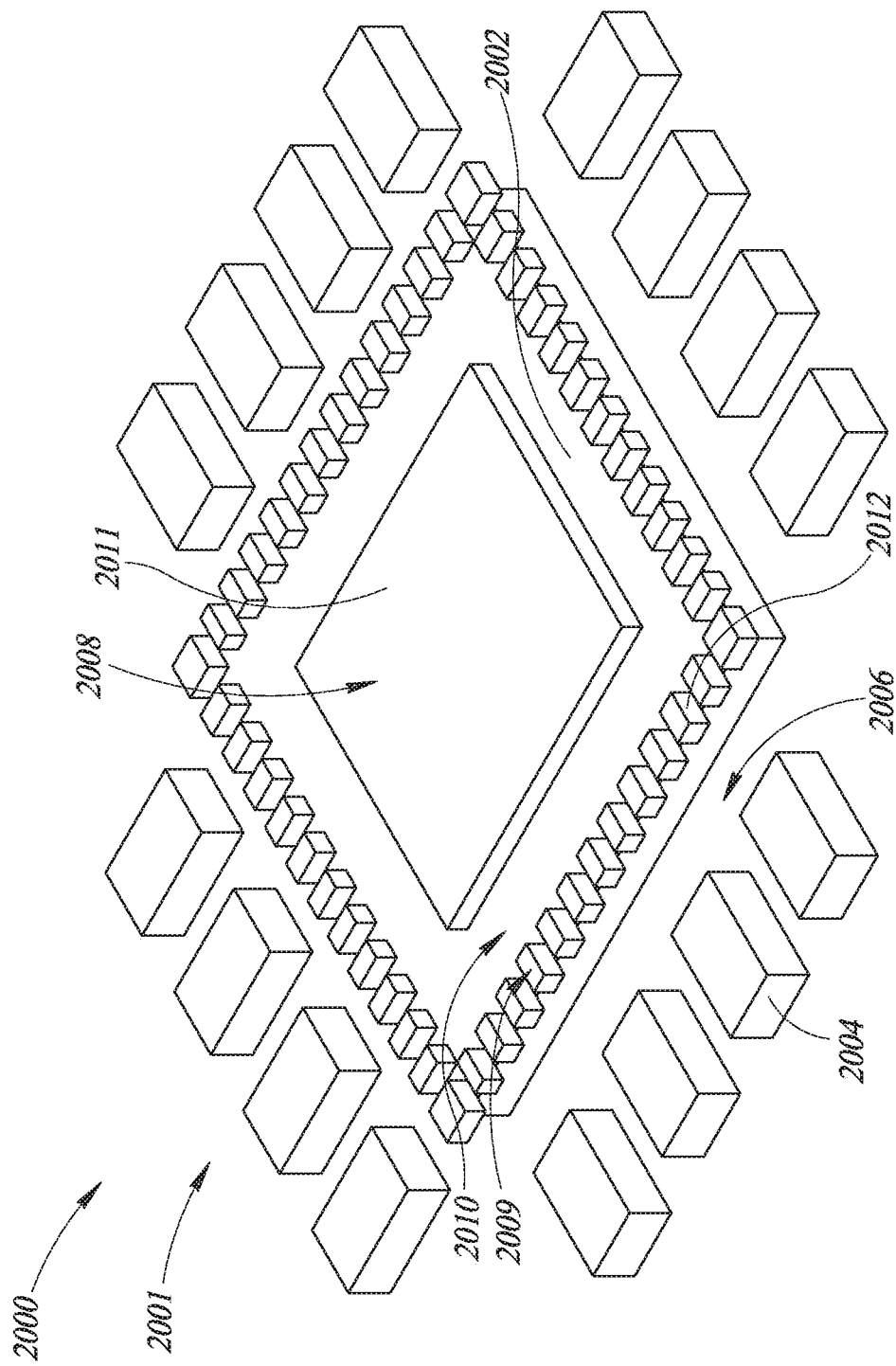

FIGS. 19 and 20 are isometric views of alternate embodiments having a cross-section shown in FIG. 18. Similar to the packages described above, a chip package 1900 includes a leadframe 1901 including a main body 1902 and a lead 1904 separated from the main body 1902 by a space 1906. The main body 1902 has a top surface that is split into a top surface 1908 and a top surface 1909 by a recess having a recess surface 1910. In some embodiments the top surface 1908 and the top surface 1909 are in the same plane. In other embodiments, the top surface 1908 and the top surface 1909 are not in the same plane. The recess forms a die pad 1911 on the main body 1902. In later steps of the manufacturing process, a semiconductor die is positioned on the die pad 1911 and secured with an adhesive that couples the semiconductor die to the leadframe 1901.

As shown in FIG. 19, one embodiment of the device depicted in FIG. 18 has a rectangular recess through a plane defined by the top surface 1908 or the top surface 1909 of the main body 1902. In this embodiment, the recess forms an anchor 1912 between the space 1906 and the recess. The anchor 1912 has an overhang that projects outward from the main body 1902. The anchor 1912 is surrounded by an encapsulant at a later step of the manufacturing process and increases the strength of the mechanical coupling between the leadframe 1901 and the encapsulant due to interlocking of the anchor 1912 and the encapsulant, and due to increased surface area between the two materials. In other embodiments, the anchor 1912 may extend around less than four sides of the main body 1902, and may not extend over an entire length of any single side. The recess is depicted having rectangular shaped etching; however, other etching shapes are possible, including irregular shapes. Additionally, a portion of the recess surface 1910 may be roughened.

Similar to the packages described above, a chip package 2000 includes a leadframe 2001 including a main body 2002 and a lead 2004 separated from the main body 2002 by a space 2006. The main body 2002 has a top surface that is split into a top surface 2008 and a top surface 2009 by a recess having a recess surface 2010. In some embodiments the top surface 2008 and the top surface 2009 are in the same plane. In other embodiments, the top surface 2008 and the top surface 2009 are not in the same plane. The recess forms a die pad 2011 on the main body 2002. In later steps of the manufacturing process, a semiconductor die is positioned on the die pad 2011 and secured with an adhesive that couples the semiconductor die to the leadframe 2001.

As shown in FIG. 20, one embodiment of the device depicted in FIG. 18 has a rectangular recess through a plane defined by the top surface 2008 or the top surface 2009 of the main body 2002. In this embodiment, the recess forms an anchor 2012 between the space 2006 and the recess. The anchor 2012 has an overhang that projects outward from the main body 2002. The anchor 2012 is surrounded by an encapsulant at a later step of the manufacturing process and increases the strength of the mechanical coupling between the leadframe 2001 and the encapsulant due to interlocking of the anchor 2012 and the encapsulant, and due to increased surface area between the two materials. In other embodiments, the anchor 2012 may extend around less than four sides of the main body 2002, and may not extend over an entire length of any single side. The recess is depicted having rectangular shaped etching; however, other etching shapes are possible, including irregular shapes. Additionally, a portion of the recess surface 2010 may be roughened.

In contrast to the anchor 1912 shown in FIG. 19, anchor 2012 has a merlon and crenel pattern, wherein the posts having tops at the top surface 2009 are merlons and the spaces between the posts are crenels. A bottom surface of the crenel is coplanar with the recess surface 2010, in some embodiments. In other embodiments, the crenel is not coplanar with the recess surface 2010. Walls of the merlons adjacent to the crenels may be planar in some embodiments and may be curved in other embodiments. The merlons have a height from the surface of the crenel to the top surface 2009, a length along the line of the merlon and crenel pattern, and a width from the space 2006 to the recess. In some embodiments, the height, length, and width of the merlon are equal. In other embodiments the height is greater than the length or the width of the merlon. In some embodiments, the length of the merlon is the same as a length of the crenel. In other embodiments, the length of the merlon is different than the length of the crenel.

Figure 21:
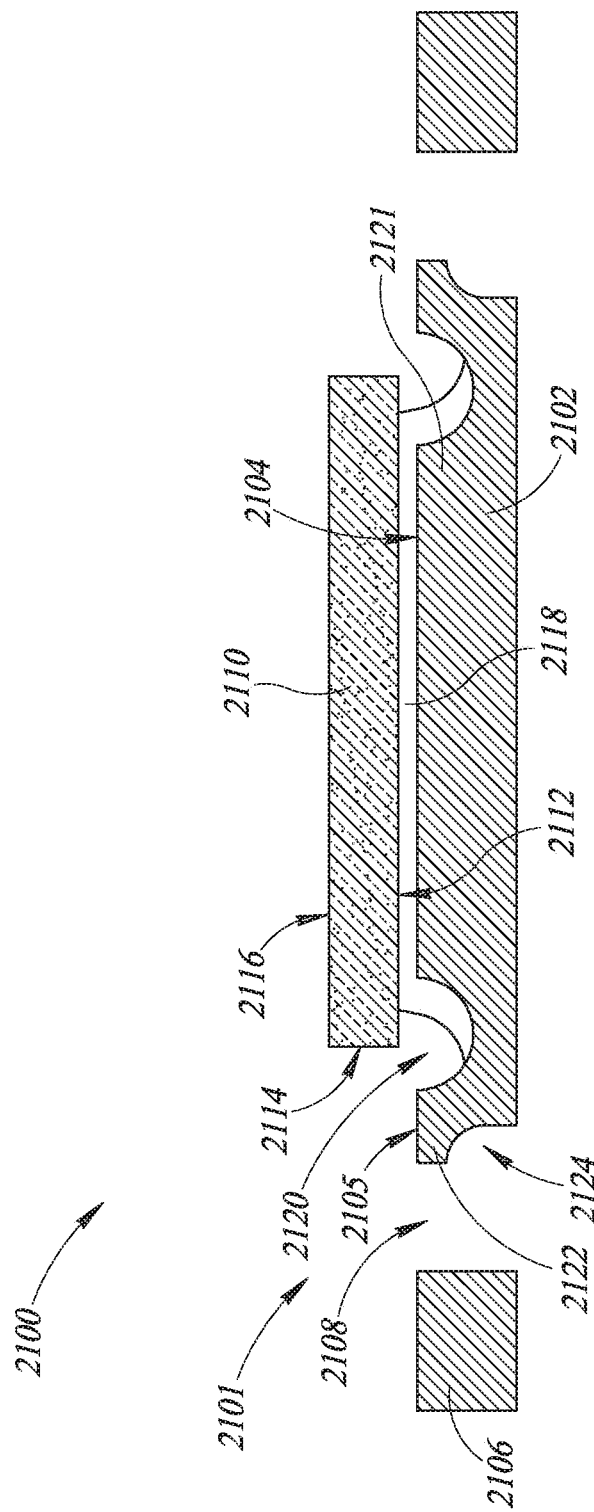
FIG. 21 is a cross-sectional view of an alternate embodiment of an exemplary leadframe having rounded recesses and anchors.

FIG. 21 is a cross-sectional view of a chip package 2100. Similar to the embodiments discussed above, the chip package 2100 includes a leadframe 2101 having a main body 2102 with a top surface 2104 and a lead 2106 separated from the main body 2102 of the leadframe 2101 by a space 2108. Attached to the leadframe 2101 is a semiconductor die 2110 having a bottom surface 2112, a side surface 2114, and a top surface 2116. Between the bottom surface 2112 of the semiconductor die 2110 and the top surface 2104 of the main body 2102 is an adhesive 2118. There is a recess 2120 formed in the main body 2102 of the leadframe 2101 forming a die pad 2121 in the main body 2102. As the semiconductor die 2110 is positioned on the die pad 2121, excess adhesive 2118 flows into the recess 2120 instead of adhering to the side surface 2114 and the top surface 2116 of the semiconductor die 2110. As can be appreciated from FIG. 21, a wall of the recess 2120 may partially form a wall of an anchor 2122 for securing an encapsulant to the leadframe 2101. The anchor 2122 has a top surface 2105 that may be coplanar with the top surface 2104 of the die pad 2121. In addition, a recess 2124 may be etched through a side surface of the main body 2102 to modify the shape of the anchor 2122. The anchor 2122 may increase the strength of the bond between the encapsulant and the leadframe 2101, protecting the integrity of the bond between leadframe 2101 and the encapsulant under stress, such as thermal or mechanical stresses. The recess 2120 is in the form of a groove, trench, or a moat that surrounds the die pads 2121.

Figure 22:
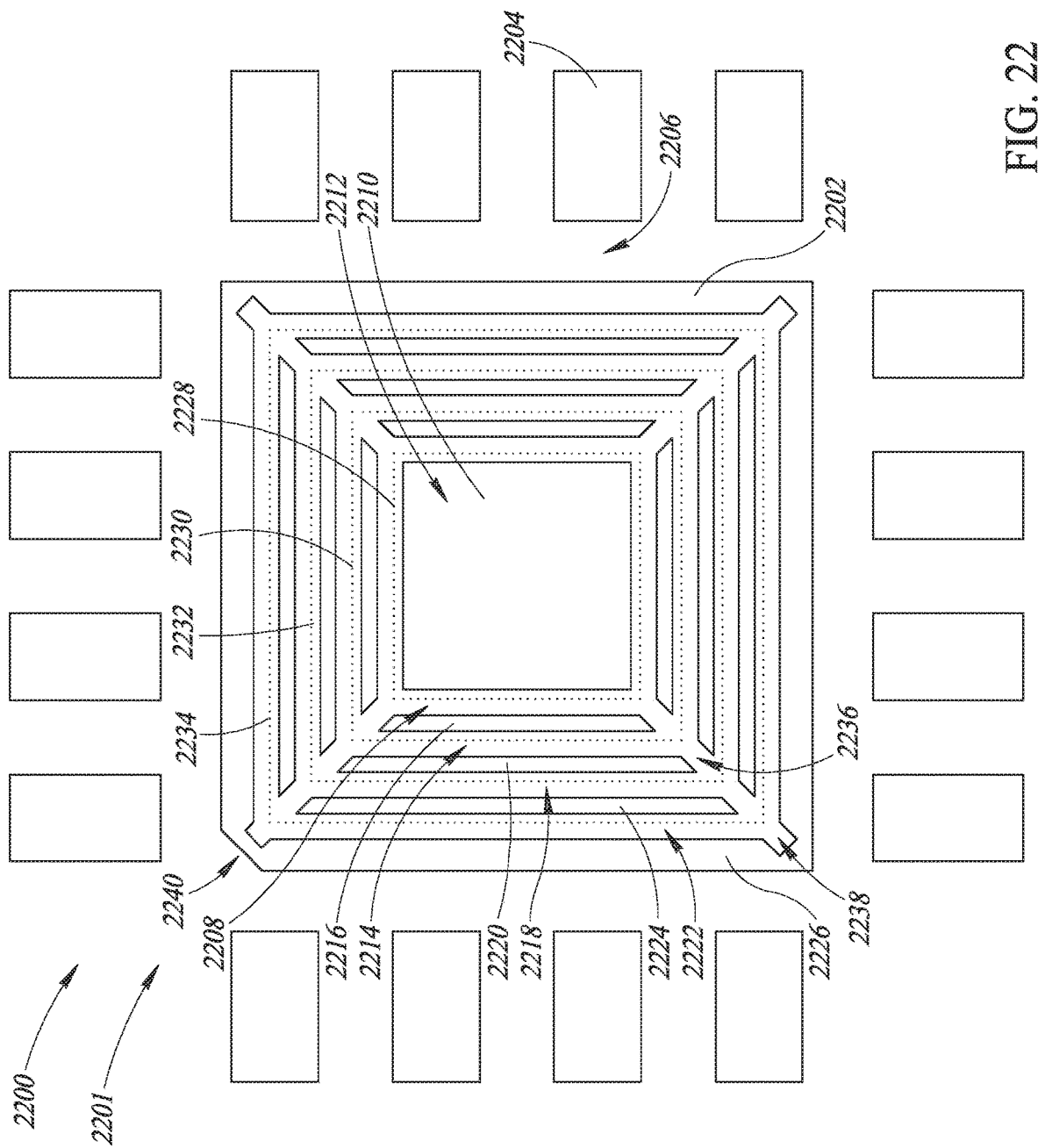
FIG. 22 is a plan view of an alternate embodiment having a plurality of recesses.

FIG. 22 is a plan view of an alternate embodiment having a plurality of recesses. FIG. 22 depicts a chip package 2200 at an intermediate stage of manufacturing. The embodiment shown in FIG. 22 has many similar features to other embodiments discussed above. For example, the chip package 2200 includes a leadframe 2201 having a main body 2202 and a lead 2204 separated from the main body 2202 by a space 2206. In addition, the main body has a first recess 2208 that forms a recess around a center die attach pad 2210 having a top surface 2212.

FIG. 22 depicts additional recesses in the main body 2202. Specifically, the main body 2202 includes a second recess 2214 forming a second recess adjacent to the first recess 2208. The second recess fully encircles the first recess. A portion of the main body 2202 between the first recess 2208 and the second recess 2014 forms a first outer die attach support 2216. The support 2216 has a top surface coplanar with the top surface 2212, in some embodiments. The main body 2202 also includes a third recess 2218 forming a third recess adjacent to the second recess 2214. The third recess fully encircles the second recess. A portion of the main body 2202 between the second recess 2214 and the third recess 2018 forms a second outer die attach support 2220. The support 2220 has a top surface coplanar with the top surface 2212 or the top surface of the support 2216, in some embodiments. Similarly, the main body 2202 also includes a fourth recess 2222 forming a fourth recess adjacent to the third recess 2218. The fourth recess fully encircles the third recess. A portion of the main body 2202 between the third recess 2218 and the fourth recess 2022 forms a third outer die attach support 2224. The support 2224 has a top surface coplanar with the top surface 2212, the top surface of the support 2216, or the top surface of the support 2220, in some embodiments. Between an outside edge of the main body 2202 and the fourth recess 2222 is an anchor 2226. The anchor 2226 may be any of the types discussed above with respect to the other embodiments. The anchor 2226 has a top surface coplanar with the top surface 2212, the top surface of the support 2216, the top surface of the support 2220, or the top surface of support 2224, in some embodiments.

The rows of recesses provide similar functionality as discussed above with respect to other embodiments. The recesses 2208, 2214 are in the form of a series of groves or trenches that surround the die pad 2210. For instance, a semiconductor die may be positioned on the die attach pad 2210 with an adhesive between the semiconductor die and the main body 2202. As the semiconductor die is com-pressed downward towards the main body 2202, excess adhesive is compressed and pushed to exterior edges of the semiconductor die. Because of the tendency of the adhesive to adhere to the semiconductor die, a mechanism is provided that helps prevent the adhesive from trying to climb the exterior edges of the semiconductor die. At least one of the recesses shown in FIG. 22 may provide this functionality. For instance, a semiconductor die with a footprint slightly larger than a footprint of the die attach pad 2210 will be positioned at a first die placement outline 2228. In this position, the semiconductor die will overhang the first recess 2208. As the semiconductor die is positioned at the first die placement outline 2228, excess adhesive will be compressed out from between the semiconductor die and the die attach pad 2210, and will flow into the first recess 2208, preventing the adhesive from climbing up the exterior edges of the semiconductor die.

The additional recesses shown in FIG. 22 allow for the functionality described above to be provided to semiconductor dice of different sizes without needing to redesign the leadframe 2201. For example, in the embodiment depicted in FIG. 22, a semiconductor die may be used that is larger than the one depicted positioned at the first die placement outline 2228. This larger die may be positioned at a second die placement outline 2230. In this position, the semiconductor die will cover the first recess 2208 and may slightly overhang the second recess 2214. As the semiconductor die is positioned at the second die placement outline 2230, excess adhesive will be compressed out from between the semiconductor die and the die attach pad 2210. The excess adhesive will fill some or all of the first recess 2208 and also overflow into the second recess 2214, preventing the adhesive from climbing up the exterior edges of the semiconductor die.

Even larger dice may be used with the leadframe 2201. In one embodiment, a larger semiconductor die is positioned at a third die placement outline 2232. In this position, the semiconductor die will cover the first recess 2208, the second recess 2014, and will overhang the third recess 2218. As the semiconductor die is positioned at the third die placement outline 2232, excess adhesive will be compressed out from between the semiconductor die and the die attach pad 2210. The excess adhesive may fill some or all of the first recess 2208, the second recess 2214, and then has room to overflow into the third recess 2218, preventing the adhesive from climbing up the exterior edges of the semiconductor die. Adhesive may be placed on top of the various supports 2216, 2220, 2224, etc., to provide further bonding of the die to the leadframe.

The embodiment shown in FIG. 22 may also be used with a semiconductor die that at least partially covers all recesses in the leadframe 2201. For example, a larger semiconductor die is positioned at a fourth die placement outline 2234. In this position, the semiconductor die will cover the first recess 2208, the second recess 2014, the third recess 2218, and will overhang the fourth recess 2222. As the semiconductor die is positioned at the fourth die placement outline 2234, excess adhesive will be compressed out from between the semiconductor die and the die attach pad 2210. The excess adhesive will fill the first recess 2208, the second recess 2214, the third recess 2218, and then overflow into the fourth recess 2222, preventing the adhesive from climbing up the exterior edges of the semiconductor die.

Some of the embodiments described throughout this specification include the variations below. In some embodiments, an adhesive is applied only to a die attach pad. In other embodiments, the adhesive is applied only in a recess.

In yet other embodiments, adhesive is applied to some combination of features; including at least one of a die attach pad, a first recess, a second recess, a first support, and a second support. Furthermore, the leadframes described above may be used with semiconductors of different sizes and different shapes. For instance, a semiconductor die with any non-square shaped footprint may be used. The leadframes described may also support more than one die, and may support a die not centrally placed on the main body of the leadframe.

Some embodiments may also include a fifth recess 2236. While the first, second, third, and fourth recesses shown in FIG. 22 form recesses that generally run parallel to sides of the main body 2202, the fifth recess 2236 generally runs radially from the center of a top surface the main body 2202 towards an edge of the main body 2202. The fifth recess 2236 may form a drain recess that puts the various other recesses in fluidic communication with one another. For instance, the fifth recess may fluidically connect the first recess 2208 to the second recess 2214. In this embodiment, as adhesive fills the first recess 2208, any excess adhesive from the first recess 2208 is expelled into the second recess 2214 through the fifth recess 2236. This feature may provide the benefit of maintaining a more even distribution of adhesive under a semiconductor die and may also help prevent pockets of gas or other contaminant from being trapped in a recess between the semiconductor die and the main body 2202. The recess formed from the fifth recess 2236 may be linear or nonlinear, for example a stair-step shape, and the recess may be linear or discontinuous between recesses. Additionally, the fifth recess may form a recess that connects all recesses, or less than all recesses.

In addition, the fifth recess may include an overflow extension 2238. Overflow extension 2238 is an extension of the recess formed by the fifth recess 2236 beyond the outer recess formed by the fourth recess 2222. The overflow extension 2238 does not connect two recesses together, but instead provides a cavity for excess adhesive to flow to from the recesses as the semiconductor die is positioned on the main body 2202.

Also included in the embodiment shown in FIG. 22 is a sixth recess 2240 in the outer edge of the main body 2202. The sixth recess 2240 provides an alignment marker for orientation of the main body 2202. The alignment marker may be detected optically or electronically, and may be detected in any one of many different stages of manufacturing, including immediately after the initial formation of the leadframe 2201 to after the finalization of the chip package 2200. In some embodiments the alignment marker will be visible through an opening in an encapsulant around the leadframe 2201 and a semiconductor die.

Figure 23:
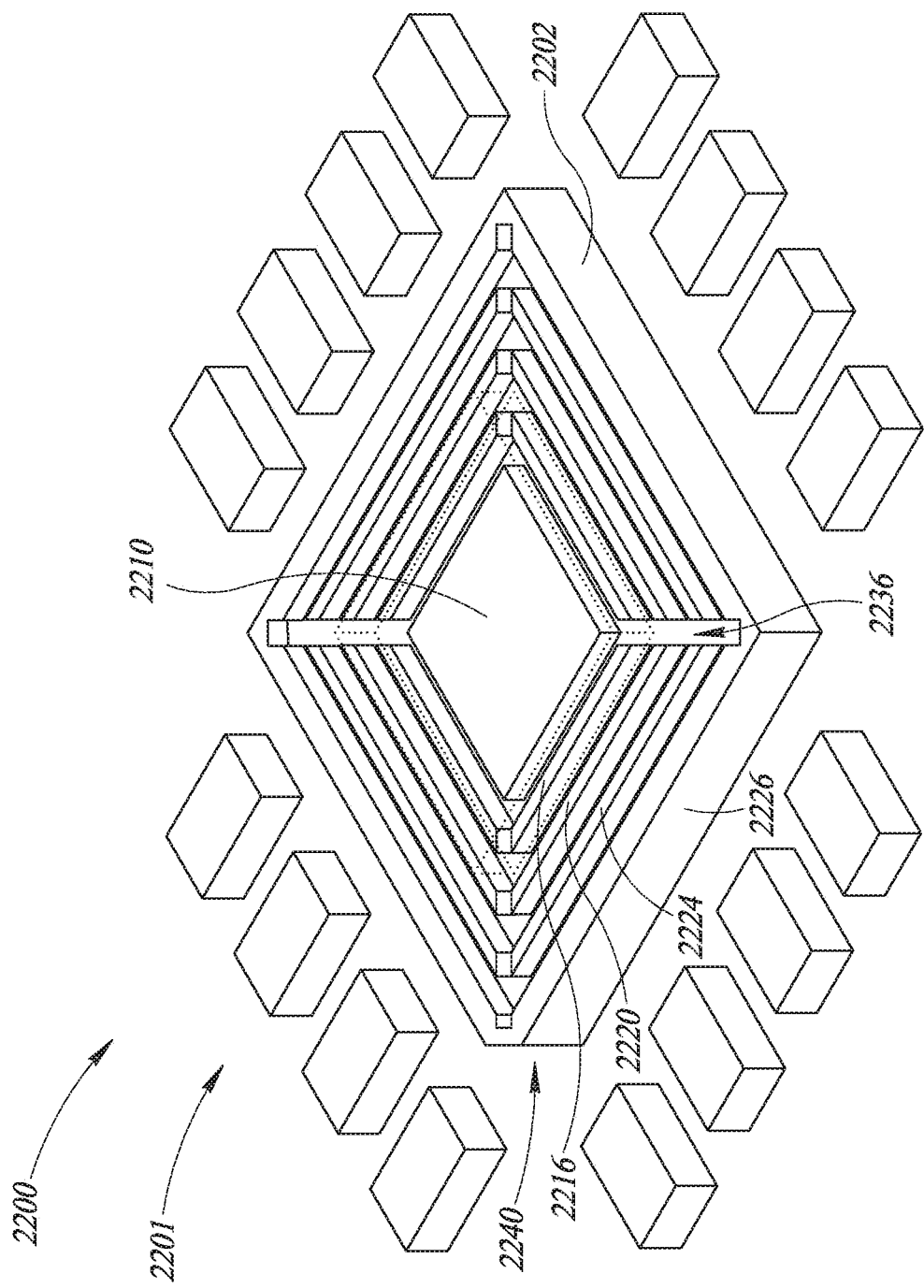
FIG. 23 is an isometric view of the alternate embodiment shown in FIG. 22.

FIG. 23 is an isometric view of the embodiment shown in FIG. 22. FIG. 23 depicts the chip package 2200 discussed above, with the leadframe 2201 having the main body 2202. The main body is shown with recesses defining the center die attach pad 2210 and the outer die attach supports 2216, 2220, 2224, and 2226. Furthermore, the fifth recess 2236 is depicted forming a drain recess that fluidically connects adjacent recesses. Also depicted is the sixth recess 2240 forming an alignment marker on the main body 2202.

Figure 24:
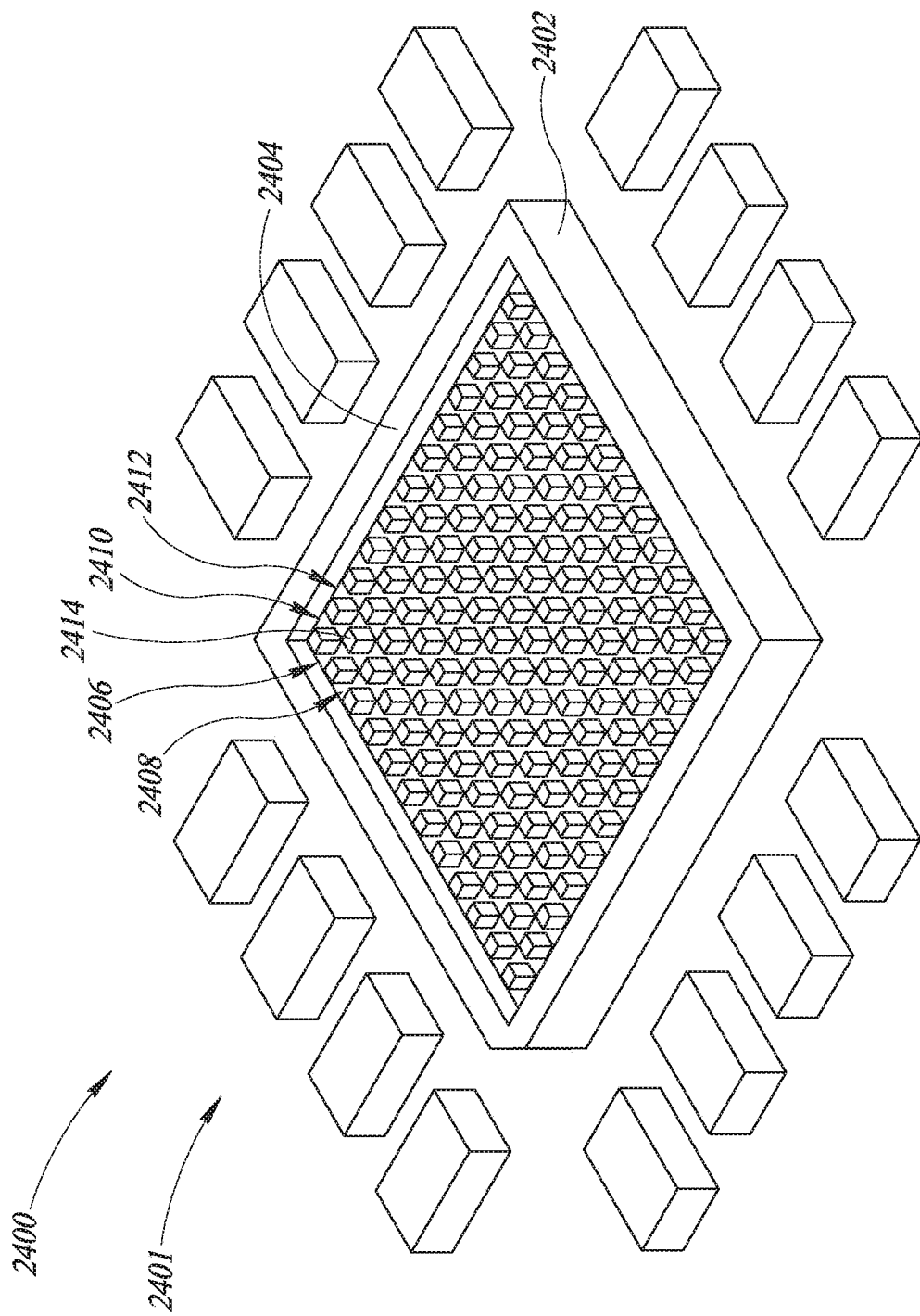
FIGS. 24 and 25 are isometric views of alternate embodiments having a plurality of recesses.

FIG. 24 is an isometric view of an alternate embodiment having a plurality of recesses. FIG. 24 depicts a chip package 2400 at an intermediate stage of manufacturing. The embodiment shown has many similar features to other embodiments discussed above. The chip package 2400 includes a leadframe 2401 having a main body 2402. However, in this embodiment a plurality of recesses are formed in close proximity to form a crossing pattern of recesses. The crossing patterns of recesses forms die attach support columns. For example, the main body 2402 includes a first recess 2406 that forms a first recess, and a second recess 2408 that forms a second recess at least approximately parallel to the first recess. The main body 2402 also includes a third recess 2410 that forms a third recess, and a fourth recess 2412 that forms a fourth recess at least approximately parallel to the third recess. The first recess is at least approximately perpendicular to the third recess, thus the intersection of the first, second, third, and fourth recesses forms a die attach support column 2414. The embodiment depicted in FIG. 24 includes a plurality of recesses forming a plurality of die attach support columns. In the embodiment of FIG. 24, the die pad can be considered as a group of columns 2414 that work together to support the die. In some embodiments, the main body 2402 may also include one or more center die attach pads anywhere on the same side as the die attach support columns. At an edge of the main body 2402, the leadframe 2401 may include an anchor 2404 as described with respect to other figures.

Figure 25:
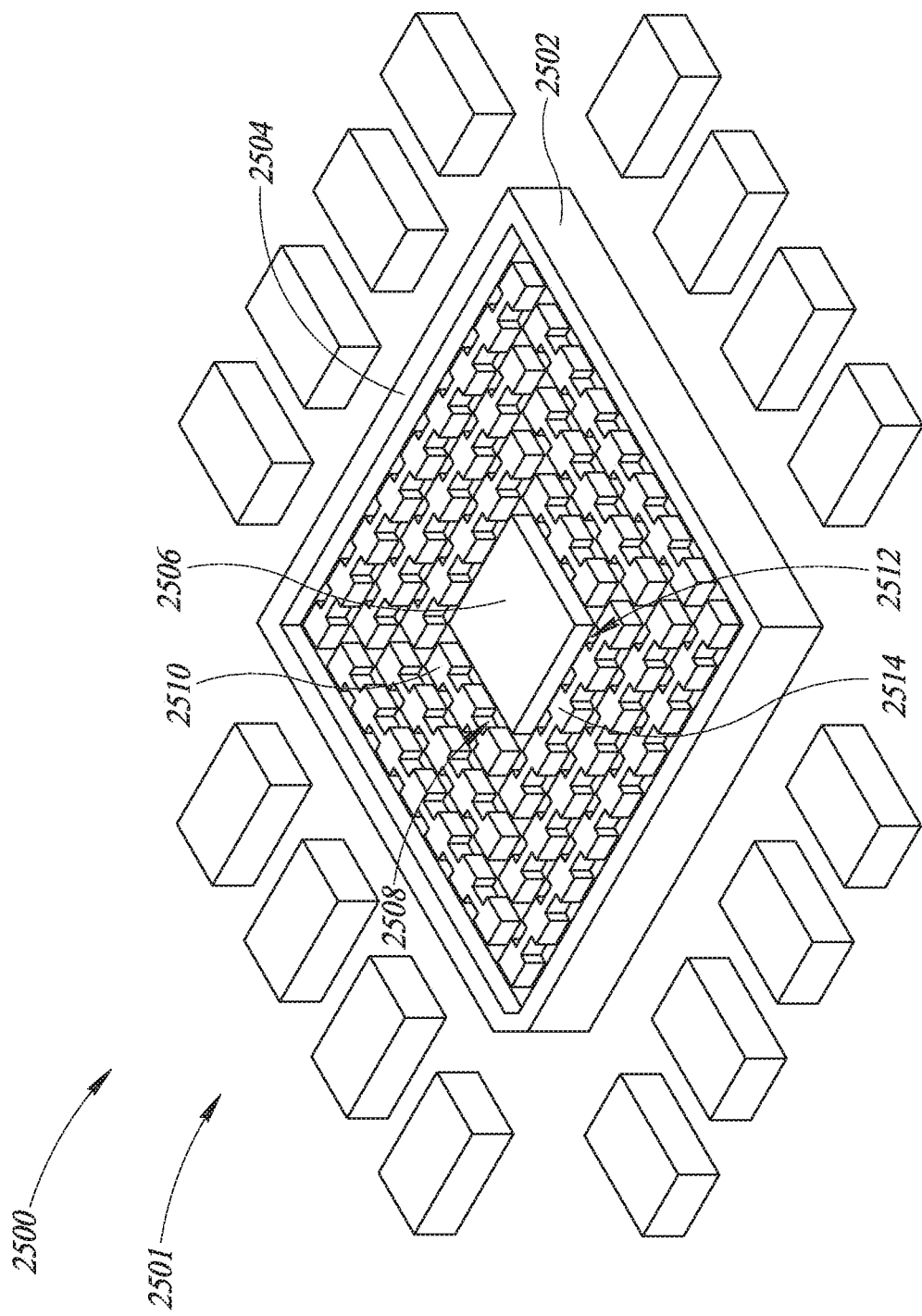

FIG. 25 is an isometric view of an alternate embodiment having a plurality of recesses. FIG. 25 depicts a chip package 2500 at an intermediate stage of manufacturing. The embodiment shown has many similar features to other embodiments discussed above. The chip package 2500 includes a leadframe 2501 having a main body 2502. However, in this embodiment a plurality of recesses are not formed as uniform recesses. The recesses instead have a varying shape, such as the ones shown in FIG. 25. A first recess 2508 is formed adjacent to a center die attach pad 2506. The first recess extends from a first side of the die attach pad 2506 to a second side opposite the first side. The first recess 2508 forms one side of a first die attach support 2510. A second recess 2512 extends along a third side of the die attach pad 2506 from a position beyond the first recess 2508 and including the first die attach support 2510. The second recess 2512 forms one side of a second die attach support 2514. In the embodiment shown in FIG. 25, the first die attach support 2510 has a smaller volume than the second die attach support 2514. In some embodiments, the first recess 2508 is in fluidic communication with the second recess. The first and second recesses may form a pattern that is repeated radially from a center of the die pad, or from some other origin point. At an edge of the main body 2502, the leadframe 2501 may include an anchor 2504 as described with respect to other figures.

The various embodiments described above can be combined to provide further embodiments. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

We claim:
1. A method, comprising:
attaching a semiconductor die to a leadframe main body at a center die pad on a first side of the leadframe main body, the first side of the leadframe main body including the center die pad and a recess portion surrounding the center die pad, the center die pad having a length and a width and protruding upward from the recess portion, wherein the semiconductor die includes a length greater than the length of the center die pad and a width greater than the width of the center die pad.

2. The method of claim 1 wherein the attaching the semiconductor die to the leadframe main body includes attaching the semiconductor die to the leadframe main body using a die attachment medium between the semiconductor die and the leadframe main body.

3. The method of claim 1 wherein the attaching the semiconductor die to the leadframe main body includes receiving overflow of the die attachment medium in the recess portion.

4. The method of claim 1 wherein the attaching the semiconductor die to the leadframe main body includes attaching the semiconductor die to the leadframe main body that includes an edge portion surrounding the recess portion, the edge portion protruding upward from the recess portion.

5. The method of claim 4 wherein the edge portion has a height that is substantially same as a height of the center die pad.

6. The method of claim 1 wherein the attaching the semiconductor die to the leadframe main body includes attaching the semiconductor die to the leadframe main body that includes an overhang portion at an edge of the leadframe main body.

7. A method, comprising:
positioning a semiconductor die over a first portion of a die pad, the die pad having the first portion and a second portion laterally surrounding the first portion, the first portion having a first height, the second portion extending from the first portion toward an edge of the die pad and having a second height that is lower than the first height,
wherein after the positioning, an edge of the semiconductor die protrudes laterally beyond the first portion of the die pad and overlaps the second portion of the monolithic die pad.

8. The method of claim 7 wherein the positioning the semiconductor die over the first portion of the die pad includes positioning the semiconductor die over the die pad that includes a third portion laterally surrounding the second portion, and wherein after the positioning, the third portion of the die pad laterally protrudes beyond the semiconductor die.

9. The method of claim 8 wherein after the positioning, the second portion of the die pad laterally protrudes beyond the semiconductor die.

10. The method of claim 7 wherein the positioning the semiconductor die over the first portion of the die pad includes positioning an adhesive between the semiconductor die and the first portion of the die pad.

11. The method of claim 10 wherein after the positioning, the adhesive encapsulates a border line between the first portion and the second portion of the die pad.

12. The method of claim 10 wherein after the positioning, overflow of the adhesive is received in the second portion of the die pad.

13. A method, comprising:
applying a die attachment medium on a central portion of a die pad, the die pad having the central portion, a peripheral portion laterally surrounding the central portion, and a trench portion between the central portion and the peripheral portion; and
positioning a semiconductor die on the die attachment medium, overflow of the die attachment medium being received in the trench portion.

14. The method of claim 13 wherein the applying the die attachment medium on the central portion of the die pad includes applying the die attachment medium on the central portion of the die pad that includes the peripheral portion and the central portion having substantially a same height.

15. The method of claim 13 wherein after the positioning the semiconductor die on the die attachment medium, an edge of the semiconductor die protrudes laterally beyond the central portion of the die pad.

16. The method of claim 13 wherein after the positioning the semiconductor die on the die attachment medium, an edge of the semiconductor die overlaps the trench portion of the die pad.

17. The method of claim 13 wherein after the positioning the semiconductor die on the die attachment medium, the peripheral portion of the die pad is free of the die attachment medium.

18. The method of claim 13 wherein the applying the die attachment medium on the central portion of the die pad includes applying an adhesive on the central portion of the die pad.

19. The method of claim 13 wherein the applying the die attachment medium on the central portion of the die pad includes applying the die attachment medium on the central portion of the die pad whose peripheral portion includes an overhang portion pointing away from the central portion of the die pad.

20. The method of claim 19 wherein the peripheral portion includes a recess portion under the overhang portion.

* * * * *